(12) United States Patent
Torimoto et al.

(10) Patent No.: US 10,870,797 B2
(45) Date of Patent: Dec. 22, 2020

(54) SEMICONDUCTOR NANOPARTICLES, METHOD OF PRODUCING SEMICONDUCTOR NANOPARTICLES, AND LIGHT-EMITTING DEVICE

(71) Applicants: NATIONAL UNIVERSITY CORPORATION NAGOYA UNIVERSITY, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Marino Kishi, Iwakura (JP); Susumu Kuwabata, Ibaraki (JP); Taro Uematsu, Suita (JP); Daisuke Oyamatsu, Tokushima (JP)

(73) Assignees: NATIONAL UNIVERSITY CORPORATION NAGOYA UNIVERSITY, Nagoya (JP); OSAKA UNIVERSITY, Osaka (JP); NICHIA CORPORATION, Anan (JP)

(*) Notice: Subject to any disclaimer, the term of this patent is extended or adjusted under 35 U.S.C. 154(b) by 0 days.

(21) Appl. No.: 16/717,271

(22) Filed: Dec. 17, 2019

(65) Prior Publication Data
US 2020/0140751 A1 May 7, 2020

Related U.S. Application Data

(62) Division of application No. 15/695,639, filed on Sep. 5, 2017, now Pat. No. 10,550,322.

(30) Foreign Application Priority Data

Sep. 6, 2016 (JP) .................................. 2016-173446
Feb. 27, 2017 (JP) .................................. 2017-034613

(51) Int. Cl.
*C09K 11/62* (2006.01)
*H01L 33/50* (2010.01)
(Continued)

(52) U.S. Cl.
CPC .......... *C09K 11/621* (2013.01); *H01L 33/502* (2013.01); *B82Y 20/00* (2013.01);
(Continued)

(58) Field of Classification Search
None
See application file for complete search history.

(56) References Cited

U.S. PATENT DOCUMENTS

2009/0278094 A1   11/2009   Torimoto et al.
2010/0193806 A1   8/2010   Byun
(Continued)

FOREIGN PATENT DOCUMENTS

JP   2009-215465 A   9/2009
JP   2009-216603 A   9/2009
(Continued)

OTHER PUBLICATIONS

Cai et al. Synthesis of AgInS2 Quantum Dots with Tunable Photoluminescene for Sensitized Solar Celss, Journal of Pwer Sources, 341 (2017) 11-18 (Available online Dec. 2, 2016).
(Continued)

*Primary Examiner* — Jay C Chang
(74) *Attorney, Agent, or Firm* — Hunton Andrews Kurth LLP

(57) ABSTRACT

Provided is a ternary or quaternary semiconductor nanoparticle that enables the band-edge emission and a less toxic composition. A semiconductor nanoparticle is provided that contains Ag, In, and S and has an average particle size of 50 nm or less, wherein the ratio of the number of atoms of Ag to the total number of atoms of Ag and In is 0.320 or more
(Continued)

and 0.385 or less, the ratio of the number of atoms of S to the total number of atoms of Ag and In is 1.20 or more and 1.45 or less. The semiconductor nanoparticle is adapted to emit photoluminescence having a photoluminescence lifetime of 200 ns or less upon being irradiated with light having a wavelength in a range of 350 nm to 500 nm.

7 Claims, 9 Drawing Sheets

(51) Int. Cl.
    *B82Y 40/00*     (2011.01)
    *B82Y 20/00*     (2011.01)

(52) U.S. Cl.
    CPC ....... *B82Y 40/00* (2013.01); *H01L 2933/0041* (2013.01); *H01L 2933/0083* (2013.01); *Y10S 977/774* (2013.01); *Y10S 977/813* (2013.01); *Y10S 977/892* (2013.01); *Y10S 977/95* (2013.01)

(56) References Cited

U.S. PATENT DOCUMENTS

| | | | |
|---|---|---|---|
| 2014/0284528 A1 | 9/2014 | Yukawa et al. | |
| 2016/0268483 A1 | 9/2016 | Bertram et al. | |
| 2017/0029697 A1* | 2/2017 | Ghosh | C09K 11/621 |

FOREIGN PATENT DOCUMENTS

| | | |
|---|---|---|
| JP | 2010-177656 A | 8/2010 |
| JP | 2012-212862 A | 11/2012 |
| JP | 2014-185224 A | 10/2014 |

OTHER PUBLICATIONS

Shi et al., Metallurgical Leaching of Metal Powder for Facile and Generalized Synthesis of Metal Sulfide Nanocrystals, Colloids and Surfaces A: Physicochemical and Engineering Aspects 497 (2016), pp. 345-350.

* cited by examiner

US 10,870,797 B2

SEMICONDUCTOR NANOPARTICLES, METHOD OF PRODUCING SEMICONDUCTOR NANOPARTICLES, AND LIGHT-EMITTING DEVICE

CROSS REFERENCE TO RELATED APPLICATIONS

This is a divisional application of U.S. patent application Ser. No. 15/695,639, filed Sep. 5, 2017 which claims the benefit of Japanese Patent Application Nos. 2016-173446, filed on Sep. 6, 2016, and 2017-034613, filed on Feb. 27, 2017, the entire contents of which all are incorporated herein by reference.

BACKGROUND

Technical Field

The present disclosure relates to semiconductor nanoparticles, a method of producing the semiconductor nanoparticles, and a light-emitting device using the semiconductor nanoparticles.

Description of Related Art

White light-emitting devices, which are used as backlights of liquid crystal display devices and the like and which utilize photoluminescence emission from quantum dots (also called "semiconductor quantum dots"), have been proposed. Fine particles of a semiconductor with a particle size of 10 nm or less, for example, are known to exhibit a quantum size effect. Such nanoparticles are called the quantum dots. The quantum size effect is a phenomenon where a valence band and a conduction band, each of which is regarded as continuous in bulk particles, become discrete when the particle size is on the nanoscale, whereby a bandgap energy is varied in accordance with their particle size.

Quantum dots absorb light and emit light corresponding to the bandgap energy thereof. Thus, quantum dots can be employed as a wavelength conversion material in light-emitting devices. Light-emitting devices using quantum dots are proposed, for example, in Japanese Unexamined Patent Application Publication No. 2012-212862 and Japanese Unexamined Patent Application Publication No. 2010-177656. More specifically, a portion of the light emitted from a light-emitting diode (LED) chip is absorbed by quantum dots, and photoluminescence of another color is emitted from the quantum dots. The photoluminescence emitted from the quantum dots and the light from the LED chip not absorbed by the quantum dots are mixed to produce white light.

In these patent application documents, use of quantum dots made of a Group 12-Group 16 material, such as CdSe or CdTe, or a Group 14-Group 16 material, such as PbS or PbSe, is proposed.

One of the advantages of using quantum dots in light-emitting devices is that light with a wavelength corresponding to a bandgap of the quantum dots can have a peak with a relatively narrow full width at half maximum. Of the quantum dots proposed as the wavelength conversion material, quantum dots made of a binary semiconductor, typified by Group 12-14 semiconductors, such as CdSe, are confirmed to emit the light with the wavelength corresponding to the bandgap of the quantum dots, i.e., band-edge emission. Meanwhile, ternary quantum dots, in particular, Group 11-13-16 quantum dots have not been confirmed to exhibit the band-edge emission.

The light emission from the Group 11-13-16 quantum dots is caused by the defect levels at the surface or inside of the particles, or by the donor-acceptor-pair recombination, so that such light has a broad photoluminescence peak with a wide full width at half maximum and a long photoluminescence lifetime. Such light emission is not suitable for light-emitting devices, particularly, used in a liquid crystal display device. This is because a light-emitting device used in a liquid crystal display device is required to emit light with a narrow full width at half maximum that has a peak wavelength corresponding to each of three primary colors (i.e., RGB) in order to ensure high color reproducibility. For this reason, practical applications of the ternary quantum dots have not been prompted despite their less toxic compositions.

SUMMARY

Therefore, one object of certain embodiments of the present disclosure is to provide semiconductor nanoparticles that are configured to produce band-edge emission from ternary quantum dots of which composition can be less toxic, and a method of producing the semiconductor nanoparticles.

According to certain embodiments of the disclosure, a method of producing semiconductor nanoparticles, the method includes:

(a) providing a salt of Ag, a salt of In, a source compound of S, and an organic solvent; and (b) placing the salt of Ag, the salt of In, and the source compound of S into the organic solvent so that the ratio of the number of atoms of Ag to the total number of atoms of Ag and In is 0.33 or more and 0.42 or less to obtain semiconductor nanoparticles.

According to other certain embodiments of the disclosure, a method of producing core-shell semiconductor nanoparticles includes:

providing a dispersion in which semiconductor nanoparticles that are produced by the method of producing semiconductor nanoparticles according to the above embodiments are dispersed into a solvent, adding, to the dispersion, a compound containing a Group 13 element and an elemental substance of a Group 16 element or a compound containing a Group 16 element, to form a semiconductor layer consisting essentially of the Group 13 element and the Group 16 element on a surface of each of the semiconductor nanoparticles.

According to further other certain embodiments of the disclosure, semiconductor nanoparticles contain Ag, In, and S, and have an average particle size of 50 nm or less.

The ratio of the number of atoms of Ag to the total number of atoms of Ag and In is 0.320 or more and 0.385 or less.

The ratio of the number of atoms of S to the total number of atoms of Ag and In is 1.20 or more and 1.45 or less.

The semiconductor nanoparticles are adapted to emit photoluminescence having a photoluminescence lifetime of 200 ns or less upon being irradiated with light having a wavelength in a range of 350 to 500 nm.

According to further other certain embodiments of the disclosure, a core-shell semiconductor nanoparticle includes a core and a shell covering a surface of the core and being in heterojunction with the core.

The core is made of a semiconductor that contains Ag, In, and S, wherein the ratio of the number of atoms of Ag to the total number of atoms of Ag and In is 0.320 or more to 0.385 or less, and the ratio of the number of atoms of S to the total number of atoms of Ag and In is 1.20 or more and 1.45 or less.

The shell is a semiconductor that consists essentially of a Group 13 element and a Group 16 element.

In a photoluminescence spectrum obtained when the core-shell semiconductor nanoparticle is irradiated with light having a wavelength in a range of 350 to 500 nm, a photoluminescence peak having a peak wavelength in a range of 550 nm to 650 nm and a full width at half maximum of 80 nm or less is observed.

According to further other certain embodiments of the disclosure, a light-emitting device including a light conversion member and a semiconductor light-emitting element, wherein the light conversion member contains the above semiconductor nanoparticles according to certain embodiments of the disclosure.

The semiconductor nanoparticles according to certain embodiments of the disclosure is made of a semiconductor that contains Ag, In, and S, which correspond to a Group 11 element, a Group 13 element, and a Group 16 element, respectively, wherein the ratio of the number of atoms of Ag to the total number of atoms of Ag and In and the ratio of the number of atoms of S to the total number of atoms of Ag and In are respectively in a specific range, and photoluminescence emission with a short photoluminescence lifetime, i.e., the band-edge emission, is obtained. The semiconductor nanoparticles can have composition that contains neither Cd nor Pb, which are highly toxic. Thus, the semiconductor nanoparticles can be applied to products that are prohibited from using Cd or the like. Therefore, such semiconductor nanoparticles are suitable for use as a wavelength conversion material for light-emitting devices used in the liquid crystal display device or the like or as a biomolecule marker. Furthermore, with the method of producing semiconductor nanoparticles as described above, the ternary semiconductor nanoparticles that exhibit band-edge emission can be relatively easily produced.

DETAILED DESCRIPTION

Figure 1:
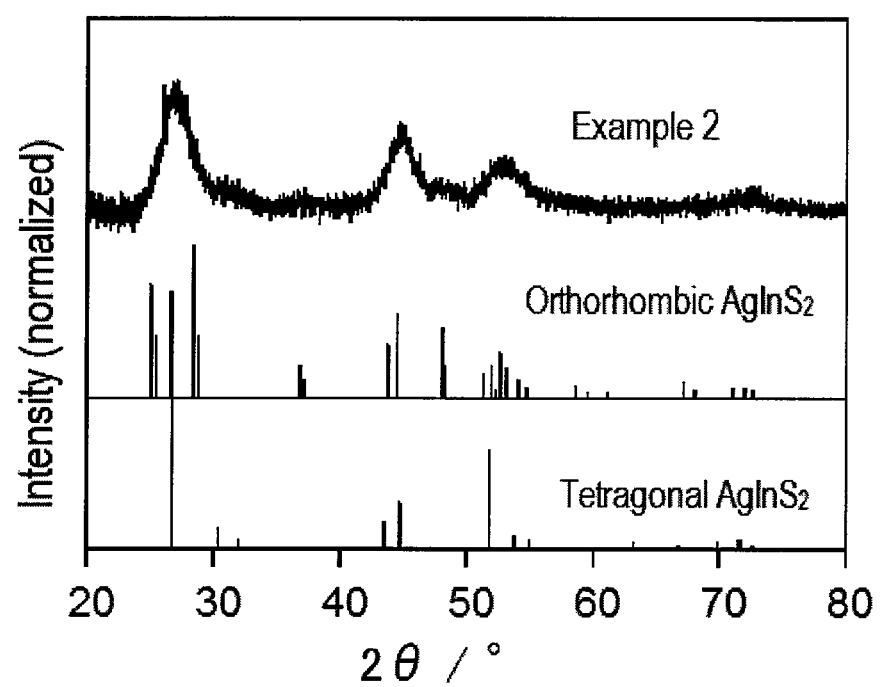
FIG. 1 shows an X-ray diffraction (XRD) pattern of semiconductor nanoparticles in Example 2.

Certain embodiments of the present disclosure will be described in detail below. Note that the present disclosure is not intended to be limited by the following embodiments. Description in one embodiment and its variant example can be applied to other embodiments and variant examples unless otherwise specified.

First Embodiment: Semiconductor Nanoparticles

As the first embodiment, semiconductor nanoparticles including Ag, In, and S will be described.

Semiconductor nanoparticles in the present embodiment are semiconductor nanoparticles that contain Ag, In, and S, and have an average particle size of 50 nm or less. The crystal structure of the semiconductor nanoparticles may be at least one selected from the group consisting of a tetragonal system, a hexagonal system, and an orthorhombic system.

A semiconductor nanoparticle containing the above specific elements and having the crystal structure of the tetragonal system, hexagonal system, or orthorhombic system is generally represented by a composition formula of $AgInS_2$, as indicated in various literature and the like. Of the semiconductors represented by the composition formula of $AgInS_2$, a semiconductor having the hexagonal system is of the wurtzite type, and a semiconductor having the tetragonal system is of the chalcopyrite type. The crystal structure is identified, for example, by measuring an X-ray diffraction (XRD) pattern obtained by X-ray diffraction. More specifically, an XRD pattern obtained from the semiconductor nanoparticles is compared with a known XRD pattern of semiconductor nanoparticles represented by the composition formula of $AgInS_2$, or an XRD pattern determined by simulation from crystal structure parameters. If one of the known patterns or simulated patterns is identical to the pattern of the semiconductor nanoparticles, the semiconductor nanoparticles can be regarded to have the same crystal structure as that of the identical known or simulated pattern.

The aggregate of the nanoparticles may contain nanoparticles with different crystal structures. In that case, the XRD pattern having peaks derived from a plurality of crystal structures is observed.

To obtain a semiconductor represented by a composition formula of $AgInS_2$, generally the semiconductor is synthesized by selecting the proportion (charging ratio) of Ag source, In source, and S source compounds so that it corresponds to the stoichiometric composition. The inventors have studied the possibility of obtaining the band-edge emission when, in a semiconductor consisting of Ag, In, and S, or a semiconductor that contains these elements, these elements have a composition out of the stoichiometric compositional ratio. As a result, the inventors have found that when semiconductor nanoparticles are produced by selecting the charging ratio of each element source so that the ratio of the number of atoms of Ag to the total number of atoms of Ag and In is 0.33 or more and 0.42 or less as mentioned later, semiconductor nanoparticles that enable the band-edge emission can be obtained despite of the non-stoichiometric composition.

In the semiconductor nanoparticles in the present embodiment, the ratio of the number of atoms of Ag to the total number of atoms of Ag and In (Ag/(Ag+In)) is 0.320 or more and 0.385 or less, and the ratio of the number of atoms of S to the total number of atoms of Ag and In (S/(Ag+In)) is 1.20 or more and 1.45 or less. The fact that Ag/(Ag+In) is 0.320 or more and 0.385 or less means that In is included in a proportion higher than the stoichiometric compositional ratio. The fact that S/(Ag+In) is 1.20 or more and 1.45 or less means that S is included in a proportion higher than the stoichiometric compositional ratio. If Ag, In, and S are included as per the stoichiometric composition, Ag/(Ag+In) becomes 0.5, and S/(Ag+In) becomes 1.

Although the reason why that the semiconductor nanoparticles in the present embodiment exhibit a relatively intense band-edge emission has not been clear, for example, it is also assumed that In and S form $In_2S_3$, which may give certain effects. This assumption does not limit the invention described in the claims.

In the present embodiment, Ag/(Ag+In) is 0.320 or more and 0.385 or less, and particularly 0.350 or more and 0.382 or less, and S/(Ag+In) is 1.20 or more and 1.45 or less, and particularly 1.25 or more and 1.40 or less. When Ag/(Ag+In) and S/(Ag+In) are respectively in these ranges, a band-edge emission is easily obtained, or a band-edge emission with higher light intensity is easily obtained.

The chemical composition of the semiconductor nanoparticles can be identified by, for example, energy dispersive X-ray spectrometry or X-ray fluorescence analysis (XRF). Ag/(Ag+In) and S/(Ag+In) are calculated based on the chemical composition measured by either of these methods.

The nanoparticles in the first embodiment may be substantially made of only Ag, In, and S. Note that the term "substantially" as used herein is used in view of possible presence of one or greater elements other than the elements Ag, In, and S that may be unintentionally mixed in as impurities or the like. Alternatively, the nanoparticles in the first embodiment may contain other elements, as long as Ag/(Ag+In) and S/(Ag+In) are in the above ranges.

The semiconductor nanoparticles in the present embodiment have an average particle size of 50 nm or less. The average particle size may be in a range of 1 nm to 20 nm, and particularly in a range of 1 nm to 10 nm. When the average particle size is over 50 nm, the quantum size effect becomes not easily exhibited, and the band-edge emission becomes not easily obtained.

The average particle size of the nanoparticles may be determined, for example, from a TEM image taken with a transmission electron microscope (TEM). More specifically, the particle size of a nanoparticle refers to, in the TEM image, the longest one of line segments that connects any two points at the outer periphery of a single particle and passes through the center of the particle.

In the case where the particle has a rod shape, the particle size thereof refers to the length of the short axis. In the present specification, the expression "rod-shaped" refers to a shape that is observed to have a quadrangular shape such as a rectangular shape (with a cross section of a circular shape, an elliptical shape, or a polygonal shape), an elliptical shape, or a polygonal shape (for example, a pencil-like shape), and have a ratio of the long axis to the short axis of more than 1.2. The "long axis" of a rod-shaped particle having an elliptical shape refers to the length of the longest one of line segments each connecting any two points on the periphery of the particle. Also, the "long axis" of a rod-shaped particle having a quadrangular or polygonal shape refers to the length of the longest one of line segments that are in parallel with the longest side of the sides defining the periphery of the particle and connect two points on the periphery of the particle. Meanwhile, the "short axis" indicates the length of the longest one of line segments that are perpendicular to the line segment defining the long axis and connect two points on the periphery of the particle.

The average particle size is an arithmetic average of the particle sizes determined by measuring the particle sizes of all the measurable nanoparticles observed in a TEM image at a magnification of 50,000× to 150,000×. Here, the "measurable particle" refers to a particle which can be observed as a whole in the TEM image. Thus, a particle that is partially "cut" or not included in an image range is not regarded as a "measurable particle".

In the case where the total number of nanoparticles included in one TEM image is 100 or more, the average particle size is determined using one TEM image. When the number of nanoparticles included in one TEM image is small, the site to be captured is changed to obtain another TEM image(s), and the particle sizes of 100 or more particles included in two or more TEM images are measured.

The semiconductor nanoparticles in the present embodiment enable the band-edge emission due to Ag/(Ag+In) and S/(Ag+In) being in the above ranges. More specifically, the semiconductor nanoparticles in the present embodiment can emit photoluminescence having a longer wavelength than that of the irradiated light and having a photoluminescence lifetime of 200 ns or less, upon being irradiated with light having a wavelength in a range of 350 nm to 500 nm. The photoluminescence emission with a photoluminescence lifetime of 200 ns or less is preferably observed as one having a full width at half maximum of 150 nm or less in the photoluminescence spectrum exhibited by the semiconductor nanoparticles.

The value of "photoluminescence lifetime" is determined in the procedure described below. First, semiconductor nanoparticles are irradiated with an excitation light to emit photoluminescence. Regarding light with wavelengths around the peak of the emission spectrum, for example, in a range of (peak wavelength ±50 nm), a change in the decay of the light (afterglow) is measured over time. The measurement of the change over time starts from a timing when the irradiation with the excitation light is stopped. In general, a decay curve is the sum of a plurality of decay curves derived from relaxation processes of such as photoluminescence emission or heat. Thus, in the present embodiment, on the assumption that the obtained decay curve contains three components (i.e., three decay curves), parameter fitting is performed such that the three-component decay curve is represented by the following formula where I(t) represents intensity of photoluminescence. The parameter fitting is performed using a dedicated software.

$$I(t) = A_1 \exp(-t/\tau_1) + A_2 \exp(-t/\tau_2) + A_3 \exp(-t/\tau_3)$$

In the above formula, each of $\tau_1$, $\tau_2$, and $\tau_3$ of the components represents the time required for attenuation of the light intensity to 1/e (36.8%) of the corresponding initial level, which corresponds to the photoluminescence lifetime of each component. The times $\tau_1$, $\tau_2$, and $\tau_3$ are named in the increasing order of the photoluminescence lifetime. A1, A2, and A3 represent contribution rates of the respective components. In the present embodiment, when the component having the maximum integral of the curve represented by $A_x \exp(-t/\tau_x)$ is assumed as the main component, τ of the main component is regarded as a photoluminescence lifetime of light whose photoluminescence lifetime is measured (light having a wavelength around the peak). Photoluminescence with a photoluminescence lifetime of 200 ns or less is assumed to be the band-edge emission. When identifying the main component, the values $A_x \times \tau_x$ of the components, which are obtained by integrating $A_x \exp(-t/\tau_x)$ from 0 to infinity with respect to t, are compared to one another, and then the component with the largest $A_x \times \tau_x$ is determined as the main component.

In this embodiment, the decay curves obtained by performing the parameter fitting assuming that the decay curve contains three, four, or five components, respectively, do not greatly differ from each other in terms of the deviation from an actual decay curve. For this reason, in the present embodiment, the number of components included in the decay curve of photoluminescence is assumed to be three when T of the main component is determined, allowing for avoiding the complexity of the parameter fitting.

Figure 3:
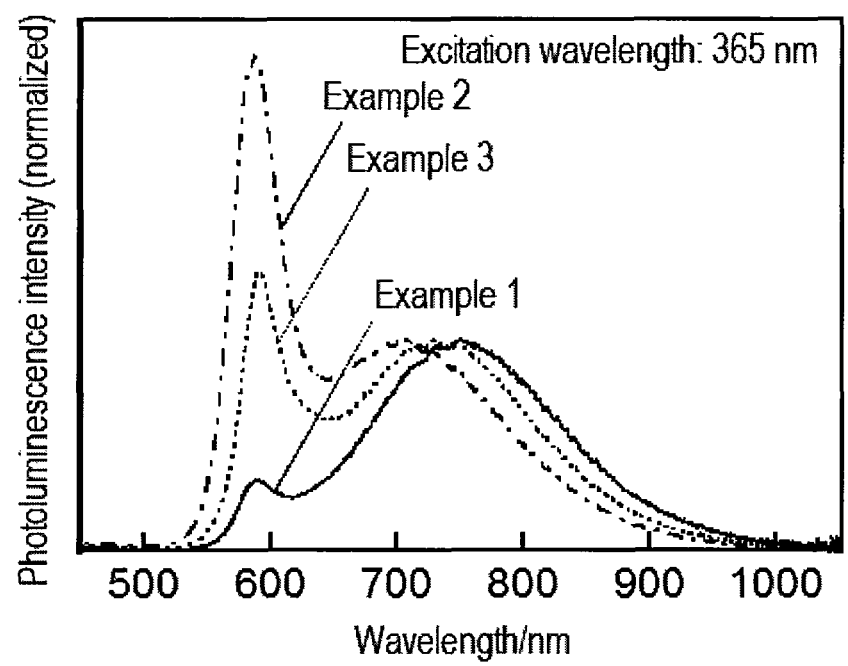
FIG. 3 shows photoluminescence spectra of the semiconductor nanoparticles in Examples 1 to 3.

The photoluminescence spectrum of the semiconductor nanoparticles in the present embodiment is obtained when the semiconductor nanoparticles are irradiated with light having one certain wavelength selected from the range of 350 nm to 1100 nm. For example, when nanoparticles having the crystal structure of the tetragonal system in which Ag/(Ag+In) is 0.361 and S/(Ag+In) is 1.30 (corresponding to Example 2 mentioned later) are irradiated with light having a wavelength of 365 nm, a photoluminescence spectrum can be obtained in which a photoluminescence peak derived from the band-edge emission is observed at around 590 nm, as shown by the dotted line in FIG. 3.

The semiconductor nanoparticles in the present embodiment may exhibit, together with the band-edge emission, other types of photoluminescence, for example, defect luminescence. The defect luminescence generally has a long photoluminescence lifetime and shows a broad spectrum whose peak is positioned on the longer-wavelength side with respect to the band-edge emission. When both band-edge emission and defect luminescence are obtained, the intensity of the band-edge emission is preferably higher than that of the defect luminescence.

The position of the peak of the band-edge emission from the semiconductor nanoparticles in the present embodiment can be changed by adjusting the shape and/or average particle size, particularly average particle size, of the semiconductor nanoparticles. For example, by decreasing the average particle size of the semiconductor nanoparticles, the bandgap energy is further increased by the quantum size effect, and the peak wavelength of the band-edge emission can be shifted toward the short-wavelength side.

Figure 2:
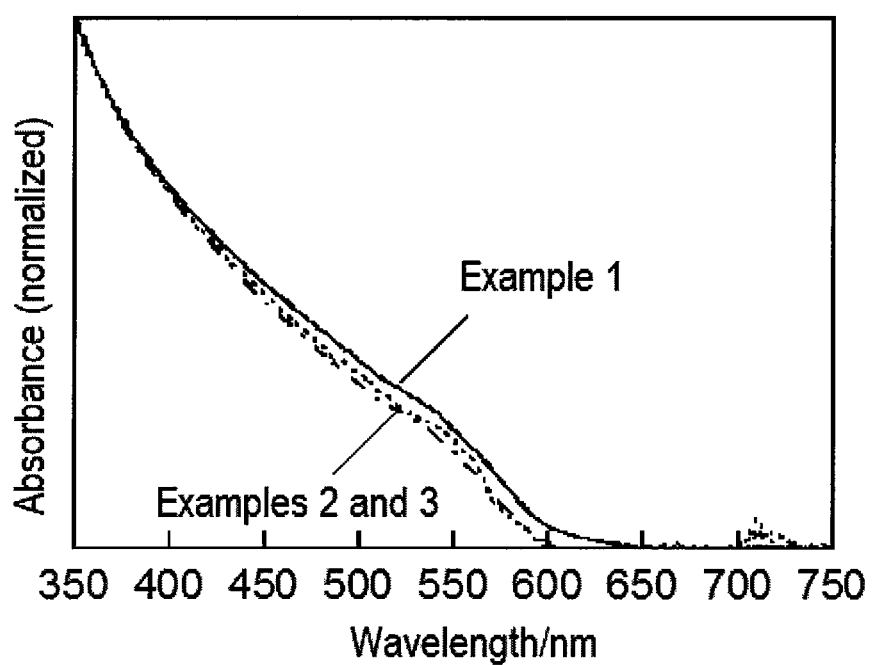
FIG. 2 shows absorption spectra of the semiconductor nanoparticles in Examples 1 to 3.

The absorption spectrum of the semiconductor nanoparticles in the present embodiment can be obtained by irradiating the semiconductor nanoparticles with light having a wavelength selected from the predetermined ranges. For example, when nanoparticles having the crystal structure of the tetragonal system in which Ag/(Ag+In) is 0.361 and S/(Ag+In) is 1.30 (corresponding to Example 2 mentioned later) are irradiated with light having a wavelength of 190 nm to 1100 nm, an absorption spectrum as shown by the solid line in FIG. 2 can be obtained. FIG. 2 shows an absorption spectrum at a wavelength in a range of about 350 nm to 750 nm, among the absorption spectra at a wavelength of 190 nm to 1100 nm.

The semiconductor nanoparticles of the present embodiment preferably have absorption spectrum in which an exciton peak is present. The exciton peak is a peak obtained by generation of an exciton. The presence of this peak in the absorption spectrum indicates that the semiconductor nanoparticles have the small distribution of particle sizes and has less crystal defects, and thus they are suitable for the band-edge emission. The sharper the exciton peak is, the greater amount of particles of uniform particle size and less crystal defects the aggregate of semiconductor nanoparticles contains. This is assumed to narrow the full width at half maximum of the photoluminescence from the nanoparticles, thereby improving the luminous efficiency. In the absorption spectrum of the semiconductor nanoparticles in this embodiment, the exciton peak is observed, for example, in a region between 350 nm and 650 nm.

The surface of the semiconductor nanoparticles in the present embodiment may be modified by any appropriate compound. A compound that modifies the surface of the nanoparticles is also called "surface modifier". A surface modifier is used for, for example, stabilizing the nanoparticle, preventing the agglomeration and growth of the nanoparticles, and/or improving the dispersibility of the nanoparticles in the solvent.

In the present embodiment, examples of a surface modifier may include a nitrogen-containing compound comprising a hydrocarbon group with a carbon number of 4 to 20, a sulfur-containing compound comprising a hydrocarbon group with a carbon number of 4 to 20, and an oxygen-containing compound comprising a hydrocarbon group with a carbon number of 4 to 20. Examples of the hydrocarbon group with the carbon number of 4 to 20 can include saturated aliphatic hydrocarbon groups, such as an n-butyl group, an isobutyl group, an n-pentyl group, an n-hexyl group, an octyl group, a decyl group, a dodecyl group, a hexadecyl group, and an octadecyl group; unsaturated aliphatic hydrocarbon groups, such as an oleyl group; alicyclic hydrocarbon groups, such as a cyclopentyl group and a cyclohexyl group; and aromatic hydrocarbon groups, such as a phenyl group, a benzyl group, a naphthyl group, and a naphthylmethyl group. Among them, the saturated aliphatic hydrocarbon groups and the unsaturated aliphatic hydrocarbon groups are preferable. Examples of nitrogen-containing compounds include amines and amides. Examples of sulfur-containing compounds include thiols. Examples of oxygen-containing compounds include fatty acids and the like.

The surface modifier is preferably a nitrogen-containing compound comprising the hydrocarbon group with the carbon number of 4 to 20. Examples of such a nitrogen-containing compound include alkyl amines, such as n-butyl amine, isobutyl amine, n-pentyl amine, n-hexyl amine, octyl amine, decyl amine, dodecyl amine, hexadecyl amine, and octadecyl amine, and alkenyl amines, such as oleyl amine.

For the surface modifier, a sulfur-containing compound comprising the hydrocarbon group with the carbon number of 4 to 20 is preferably used. Examples of such a sulfur-containing compound include n-butanethiol, isobutanethiol, n-pentanethiol, n-hexanethiol, octanethiol, decanethiol, dodecanethiol, hexadecanethiol, and octadecanethiol.

For the surface modifier, a combination of two or more different surface modifiers may be used. For example, one compound (e.g., oleylamine) selected from the nitrogen-containing compounds exemplified above, and one compound (e.g., dodecanethiol) selected from the sulfur-containing compounds exemplified above may be used in combination.

Second Embodiment: Method of Producing Semiconductor Nanoparticles

Next, as the second embodiment, a method of producing the semiconductor nanoparticles in the first embodiment will be described. The production method in the present embodiment is a method of producing semiconductor nanoparticles, the method including:

(a) providing the salt of Ag, the salt of In, the source compound of S, and the organic solvent; and (b) producing semiconductor nanoparticles by placing the salt of Ag, the salt of In, and the source compound of S into the organic solvent so that the ratio of the number of atoms of Ag to the total number of atoms of Ag and In is 0.33 or more and 0.42 or less.

This production method is characterized by placing the salt of Ag, the salt of In, and the source compound of S into the organic solvent so that the ratio of the number of atoms of Ag to the total number of atoms of Ag and In (Ag/Ag+In) is 0.33 or more and 0.42 or less. By placing the source of each element so that Ag/(Ag+In) is in the above-mentioned range, Ag—In—S semiconductor nanoparticles in which Ag/(Ag+In) is in the range described in the first embodiment can be obtained. In other words, the production method in the present embodiment is characterized by producing semiconductor nanoparticles with the charging ratio of the source of each element at a specific ratio that does not correspond to the stoichiometric compositional ratio.

First Method of Producing the Semiconductor Nanoparticles

For example, the semiconductor nanoparticles may be produced by a method in which a salt of Ag, a salt of In, and, as a source compound of S, a compound that may form a complex wherein S is a coordination element are mixed to give a complex, and then the complex is heat-treated. Any kinds of a salt of Ag and a salt of In may be employed, and either an organic acid salt or an inorganic acid salt may be employed. More specifically, the salt may be any one of a nitrate salt, an acetate salt, a hydrosulfate salt, a hydrochloride salt, and a sulfonate salt, and is preferably an organic acid salt, such as an acetate salt. This is because the organic acid salt has high solubility in an organic solvent, which allows the reaction to proceed uniformly.

Examples of the source compound of S used in this production method include β-dithiones, such as 2,4-pentanedithione; dithiols, such as 1,2-bis(trifluoromethyl)ethylene-1,2-dithiol; diethyldithiocarbamate; and thiourea.

The complex is obtained by mixing the salt of Ag, the salt of In, and the source compound of S. The complex may be formed by a method in which the salt of Ag, the salt of In, and the source compound of S are placed into water or an organic solvent (in particular, an organic solvent with high polarity, such as ethanol, methanol, or acetone) and then mixed.

The organic solvent may be a surface modifier itself, or may contain a surface modifier. The surface modifier is as described in relation to the first embodiment. Particularly, it is preferable to use an organic solvent that contains at least one solvent selected from thiols comprising a hydrocarbon group with the carbon number of 4 to 20 and at least one solvent selected from amines comprising a hydrocarbon group with the carbon number of 4 to 20, or that consists of a combination thereof.

In the production method accompanied by the formation of a complex, the solvent is selected so that the complex is formed. For example, when water or the organic solvent cannot dissolve the salt of Ag, the salt of In, and the source compound of S, the complex is not formed, or the complex becomes not easily formed. Nevertheless, even when the organic solvent cannot dissolve the salt of Ag, the salt of In, and the source compound of S, some combinations of the source compound of each element may lead to the production of semiconductor nanoparticles without a function of the source compound of S as a ligand, as described in "Method of Producing the Second Semiconductor Nanoparticles" below.

Here, the salt of Ag, the salt of In, and the source compound of S are used in the amount so that the ratio of the number of atoms of Ag to the total number of atoms of Ag and In (Ag/(Ag+In)) is 0.33 or more and 0.42 or less. The source compound of S is preferably used in the amount so that the ratio of the number of atoms of S to the total number of atoms of Ag and In (S/(Ag+In)) is 0.95 or more and 1.20 or less. By using the source compound of each element to meet these conditions, semiconductor nanoparticles that easily exhibit the band-edge emission or that have high intensity of the band-edge emission can be produced.

Ag/(Ag+In) is more preferably 0.38 or more and 0.42 or less, and particularly 0.40. S/(Ag+In) is more preferably 0.95 or more and 1.10 or less, and particularly 1.00.

Next, the obtained complex is subjected to heat treatment to form the semiconductor nanoparticles. The heat treatment of the complex may be performed by placing the salts and the source compound of S into the organic solvent, which is a surface modifier or a solvent containing the surface modifier, and then subjected to the heat treatment, which allows for continuously or simultaneously performing the complex formation, the heat treatment, and the surface modification.

The above heat treatment is preferably performed at a temperature of 230° C. or more and 260° C. or less for 3 minutes or more. The heating time is more preferably 5 minutes or more, still more preferably 8 minutes or more, and most preferably 10 minutes or more. More preferable heating temperature is 245° C. or more and 255° C. or less, and particularly may be 250° C. The heating time is, for example, 60 minutes or less, and particularly 30 minutes or less. The heating time may be 10 minutes.

Alternatively, the above heat treatment may be performed at a temperature of 30° C. or more and 190° C. or less for 1 minute or more and 15 minutes or less, and then at a temperature of 230° C. or more and 260° C. or less for 3 minutes or more. When the heat treatment is performed in two steps, semiconductor nanoparticles having higher intensity of the band-edge emission are easily obtained. In this case, the heating temperature in the first step is more preferably 45° C. to 155° C., still more preferably 145° C. to 155° C., and particularly may be 150° C. The heating time in the first step is more preferably 8 minutes or more and 13 minutes or less, still more preferably 9 minutes or more and 11 minutes or less, and particularly 10 minutes. The heating time in the second step is more preferably 5 minutes or more, still more preferably 8 minutes or more, and most preferably 10 minutes or more. The heating temperature in the second step is more preferably 245° C. or more and 255° C. or less, and particularly may be 250° C. The heating time in the second step is, for example, 60 minutes or less, and particularly 30 minutes or less. The heating time may be 10 minutes.

The heat treatment in two steps can produce semiconductor nanoparticles having relatively high intensity of the band-edge emission with good reproducibility.

Second Method of Producing the Semiconductor Nanoparticles

The semiconductor nanoparticles may be produced by a method in which the salt of Ag, the salt of In, and the source compound of S into an organic solvent at once and then the organic solvent is heated. With this method, nanoparticles can be synthesized in one pot with good reproducibility by simple operations.

Alternatively, the semiconductor nanoparticles may be produced by a method that includes forming a complex by a reaction between the organic solvent and the salt of Ag, forming another complex by a reaction between the organic solvent and the salt of In, reacting these complexes with the source compound of S to produce a reaction product, and growing crystals of the obtained reaction product. In this case, heating is performed in the step of reacting the source compound of S.

The salt of Ag and the salt of In have been described above in relation to the production method including the formation of complex (the first method of producing the semiconductor nanoparticles).

Examples of the organic solvent include amines comprising a hydrocarbon group with the carbon number of 4 to 20, particularly alkylamines or alkenylamines with the carbon number of 4 to 20; thiols comprising a hydrocarbon group with the carbon number of 4 to 20, particularly alkylthiols or alkenylthiols with the carbon number of 4 to 20; phosphines comprising a hydrocarbon group with the carbon number of 4 to 20, particularly alkylphosphines or alkenylphosphines with the carbon number of 4 to 20. These organic solvents finally serve to modify the surfaces of the obtained semiconductor nanoparticles. Two or more of these organic solvents may be used in combination. In particular, a mixed solvent that contains at least one solvent selected from thiols comprising a hydrocarbon group with the carbon number of 4 to 20 and at least one solvent selected from amines comprising a hydrocarbon group with the carbon number of 4 to 20 may be used. Such organic solvents may be used mixed with other organic solvents.

In the second production method, examples of a source compound of S include sulfur, thiourea, thioacetamide, and alkylthiol.

Also when this production method is employed, the salt of Ag, the salt of In, and the source compound of S are used in the amount so that the ratio of the number of atoms of Ag to the total number of atoms of Ag and In (Ag/(Ag+In)) is 0.33 or more and 0.42 or less. The source compound of S is preferably used in the amount so that the ratio of the number of atoms of S to the total number of atoms of Ag and In (S/(Ag+In)) is 0.95 or more and 1.20 or less. By using the source compound of each element to meet these conditions, semiconductor nanoparticles that easily exhibit the band-edge emission can be produced.

Ag/(Ag+In) is more preferably 0.38 or more and 0.42 or less, and particularly 0.40. S/(Ag+In) is more preferably 0.95 or more and 1.10 or less, and particularly 1.00.

The heat treatment is preferably performed at a temperature of 230° C. or more and 260° C. or less for 3 minutes or more. The heating time is more preferably 5 minutes or more, still more preferably 8 minutes or more, and most preferably 10 minutes or more. More preferable heating temperature is 245° C. or more and 255° C. or less, and particularly may be 250° C. The heating time is, for example, 60 minutes or less, and particularly 30 minutes or less. The heating time may be 10 minutes.

Alternatively, the heat treatment may be performed at a temperature of 30° C. or more and 190° C. or less for 1 minute or more and 15 minutes or less, and then at a temperature of 230° C. or more and 260° C. or less for 3 minutes or more. When the heat treatment is performed in two steps, semiconductor nanoparticles having higher intensity of the band-edge emission are easily obtained. In this case, the heating temperature in the first step is more preferably 45° C. to 155° C., still more preferably 145° C. to 155° C., and particularly may be 150° C. The heating time in the first step is more preferably 8 minutes or more and 13 minutes or less, still more preferably 9 minutes or more and 11 minutes or less, and particularly 10 minutes. The heating time in the second step is more preferably 5 minutes or more, still more preferably 8 minutes or more, and most preferably 10 minutes or more. The heating temperature in the second step is more preferably 245° C. or more and 255° C. or less, and particularly may be 250° C. The heating time in the second step is, for example, 60 minutes or less, and particularly 30 minutes or less. The heating time may be 10 minutes.

The heat treatment in two steps can produce semiconductor nanoparticles having relatively high intensity of the band-edge emission with good reproducibility.

Third Method of Producing the Semiconductor Nanoparticles

The semiconductor nanoparticles may be produced by using a so-called hot-injection method. The hot-injection method is a method of producing semiconductor nanoparticles in which a solution (also called as a precursor solution) in which source compounds of respective elements (e.g., a salt of Ag, a salt of In, and a source compound of S) are dissolved or dispersed is charged into a solvent heated at a temperature in a range of 100° C. to 300° C. for a short time (e.g. milliseconds order), thereby forming a number of crystal nuclei in an initial reaction stage.

Alternatively, the hot-injection method may involve: dissolving or dispersing source compounds of some of the elements in an organic solvent, followed by heating it; and subsequently charging a precursor solution containing the remaining elements into the organic solvent. In the case where the solvent is the surface modifier, or a solvent containing the surface modifier, the modification of the surfaces of the particles can be performed simultaneously. The surface modifier is as described in relation to the first embodiment.

Also in the hot-injection method, the source compounds of respective elements that are finally charged into a solvent are used in the amount so that the ratio of the number of atoms of Ag to the total number of atoms of Ag and In (Ag/(Ag+In)) is 0.33 or more and 0.42 or less. The source compound of S is preferably used in the amount so that the ratio of the number of atoms of S to the total number of atoms of Ag and In (S/(Ag+In)) is 0.95 or more and 1.20 or less. By using the source compound of each element to meet these conditions, semiconductor nanoparticles that easily exhibit the band-edge emission or that have high intensity of the band-edge emission can be produced.

Ag/(Ag+In) is more preferably is 0.38 or more and 0.42 or less, and particularly 0.40. S/(Ag+In) is more preferably 0.95 or more and 1.10 or less, and particularly 1.00.

The method of producing the semiconductor nanoparticles is not limited to the above methods. Any appropriate method may be used, as long as the amount of the source compound of each element used is selected so that Ag/(Ag+In) is 0.33 or more and 0.42 or less.

In the case of employing any of these methods, the semiconductor nanoparticles are produced under an inert atmosphere, particularly, under an argon atmosphere or a nitrogen atmosphere. This is for reducing or preventing the subgeneration of oxides and the oxidation of the surface of the semiconductor nanoparticle.

In any of these production methods, when the heat treatment is performed, the temperature increasing rate until the temperature reaches the predetermined heating temperature (for example, temperature that is hold for a certain time) may be, for example, 1° C./min to 50° C./min. After heat treatment, cooling may be performed, for example, at a temperature decreasing rate of 1° C./min to 100° C./min so that the temperature is decreased to the predetermined temperature. Alternatively, cooling after heat treatment may be performed by allowing to cool by turning off a heating source.

In any of these production methods, after the end of the production of the semiconductor nanoparticles, the obtained semiconductor nanoparticles may be separated from the treated organic solvent, and may be refined as needed. The separation is performed, for example, by centrifuging an organic solvent containing the nanoparticles after the end of the production, and taking out a supernatant solution containing the nanoparticles. The refinement includes, for example, adding an organic solvent to the supernatant solution, centrifuging the supernatant solution, and taking out the semiconductor nanoparticles as precipitates. The precipitates themselves may be taken out, or the precipitates may be taken out by removing the supernatant solution. The precipitates taken out may be dried, for example, by vacuum deaeration or natural drying, or alternatively, by a combination of the vacuum deaeration and natural drying. The natural drying may be performed, for example, by leaving the particles in the atmosphere at normal temperature and pressure. In this case, the particles are left for 20 hours or more, for example, for approximately 30 hours.

Alternatively, the precipitates taken out may be dissolved in an organic solvent. The refinement (including the addition of alcohol and the centrifugation) may be performed a plurality of times as needed. Examples of an alcohol for use in the refinement include a lower alcohol, such as methanol, ethanol, and n-propanol. In the case of dissolving the precipitates in an organic solvent, examples of organic solvents include chloroform, toluene, cyclohexane, hexane, pentane, and octane.

The semiconductor nanoparticles obtained in this way tend to be obtained in the form wherein the ratio of the number of atoms of Ag to the total number of atoms of Ag and In is smaller than the ratio of the number of atoms of Ag to the total number of atoms of Ag and In, in the salt of Ag and the salt of In that are placed into an organic solvent. Therefore, according to the production method in the present embodiment, it is possible to produce semiconductor nanoparticles including Ag, In, and S, wherein, for example, the ratio of the number of atoms of Ag to the total number of atoms of Ag and In is 0.320 or more and 0.385 or less, and the ratio of the number of atoms of S to the total number of atoms of Ag and In is 1.20 or more and 1.45 or less. The semiconductor nanoparticles can emit photoluminescence having a photoluminescence lifetime of 200 ns or less upon being irradiated with light having a wavelength in a range of 350 to 500 nm.

When the organic solvent is a surface modifier itself, or contains a surface modifier, semiconductor nanoparticles of which surface is modified can be obtained.

Third Embodiment: Core-Shell Semiconductor Nanoparticles

As the third embodiment, a core-shell semiconductor nanoparticle that includes a core and a shell covering a surface of the core and being in heterojunction with the core will be described.

In the present embodiment, the core is the semiconductor nanoparticle described as the first embodiment. Thus, its detailed description will be omitted.

The shell is formed of a semiconductor that consists essentially of a Group 13 element and a Group 16 element. The semiconductor constituting the shell may be a semiconductor that has a bandgap energy larger than a bandgap energy of the semiconductor constituting the core. Examples of the Group 13 element can include B, Al, Ga, In, and Tl, and examples of the Group 16 element can include O, S, Se, Te, and Po.

When the semiconductor nanoparticle (core) in the first embodiment is covered with the semiconductor (shell) that consists essentially of a Group 13 element and a Group 16 element, the proportion of the band-edge emission can be higher and the proportion of photoluminescence other than the band-edge emission (particularly defect luminescence) can be lower, compared with when no shell is used. It is assumed that this is because covering the core with the shell results in no surface defect site of the core. In the present embodiment, it is assumed that in the case where the shell has a bandgap energy larger than that of the core, an energetic barrier is formed, resulting in a higher proportion of the band-edge emission.

Examples of a combination of a Group 13 element and a Group 16 element of the shell may include a combination of Ga and S. The combination of Ga and S is preferably used since it has a larger bandgap energy. The combination of Ga and S may be gallium sulfide. In the present embodiment, gallium sulfide forming the shell may not be stoichiometric (that is, $Ga_2S_3$), and thus may be represented by the formula of $GaS_x$ (where x is any number that is not limited to an integer number, e.g., in a range of 0.8 to 1.5) in the present specification.

The shell may be amorphous. Whether the amorphous shell is formed or not can be confirmed by observing the core-shell semiconductor nanoparticles of this embodiment with a high-angle annular dark field (HAADF)-scanning transmission electron microscope (STEM). More specifically, in an HAADF-STEM image, a portion with a regular pattern (e.g., a striped pattern or a dot pattern) is observed at the center, while a portion with no regular pattern is observed at the periphery of the portion with the regular pattern. With the HAADF-STEM, a regular structure, such as crystal material, is observed as an image with a regular pattern, while a non-regular structure, such as amorphous material, is not observed as an image with a regular pattern. For this reason, when the shell is amorphous, the shell can be observed as a part definitely different from the core, which is observed as an image with a regular pattern (as it has the crystal structure, such as a tetragonal system, as mentioned above).

When the core is made of Ag—In—S, and the shell is made of GaS, in the image obtained by the HAADF-STEM, the shell tends to be observed as an image part darker than that of the core because Ga is an element with a weight smaller than each of Ag and In.

The surface of the shell may be modified by any appropriate compound. In the case where the surface of the shell is an exposed surface of the core-shell semiconductor nanoparticle, modification of the exposed surface allows for stabilizing the nanoparticle, and preventing the agglomeration and growth of the semiconductor nanoparticles, and/or improving the dispersibility of the semiconductor nanoparticles in the solvent. Applicable compounds as a surface modifier were as previously described in the first embodiment, and thus their description will be omitted here.

The core-shell semiconductor nanoparticles may have an average particle size of 50 nm or less. The average particle size may be in a range of 1 nm to 20 nm, and particularly in a range of 1 nm to 10 nm. The particle size and the method of determining the average particle size are as described in the first embodiment.

In the core-shell semiconductor nanoparticle, the core may have an average particle size of, for example, 10 nm or less, and particularly, 8 nm or less. The average particle size of the core may be in a range of 2 nm to 10 nm, particularly 2 nm to 8 nm, more particularly 2 nm to 6 nm, or alternatively in a range of 4 nm to 10 nm or in a range of 5 nm to 8 nm. If the average particle size of the core is too large, the quantum size effect is not easily exhibited, so that band-edge emission is not easily obtained.

The shell may have a thickness of 0.1 nm or more. The thickness of the shell may be in a range of 0.1 nm to 50 nm, particularly 0.1 nm to 20 nm, and more particularly 0.2 nm to 10 nm. Alternatively, the thickness of the shell may be in a range of 0.1 nm to 3 nm, and particularly 0.3 nm to 3 nm. If the thickness of the shell is too small, the effect obtained by coating the core with the shell may not be sufficiently exhibited, so that band-edge emission is not easily obtained.

The average particle size of the core and the thickness of the shell may be determined by observing the core-shell semiconductor nanoparticle, for example, with the HAADF-STEM. In particular, in the case where the shell is amorphous, the shell is easily observed as a different part from the core, so that the thickness of the shell can be determined easily using the HAADF-STEM. In that case, the particle size of the core can be determined by the method described above for that of the semiconductor nanoparticle. In the case where the thickness of the shell is not uniform, the thickness of the shell in the particle refers to the smallest thickness among the measured values.

Alternatively, the average particle size of the core may be measured in advance before being coated with the shell. Then, an average particle size of the core-shell semiconductor nanoparticles may be measured. Subsequently, a difference between the average particle size of the core-shell semiconductor nanoparticles and the average particle size of the core measured in advance may be calculated to determine the thickness of the shell.

The core-shell semiconductor nanoparticles in the present embodiment are the semiconductor nanoparticles of which core is as described in the first embodiment, and enable the band-edge emission due to $Ag/(Ag+In)$ and $S/(Ag+In)$ being in the above-mentioned particular ranges. More specifically, in a photoluminescence spectrum obtained when the core-shell semiconductor nanoparticles are irradiated with light having a wavelength in a range of 350 to 500 nm, a photoluminescence peak having a peak wavelength in a range of 550 nm to 650 nm and a full width at half maximum of 80 nm or less, particularly 50 nm or less is observed at 25° C. The lower limit of the full width at half maximum may be, for example, 20 nm, and particularly 10 nm.

The core-shell semiconductor nanoparticles in the present embodiment can emit the band-edge emission in a larger proportion since the above specific core is covered with the above specific shell. More specifically, the core-shell semiconductor nanoparticles in the present embodiment can exhibit a photoluminescence spectrum wherein the intensity of the band-edge emission that is normalized by the intensity of the defect luminescence is, for example, 5 to 300, and particularly 20 to 150. The core-shell semiconductor nanoparticles in the present embodiment preferably do not emit light derived from the defect luminescence.

The photoluminescence lifetime of the band-edge emission exhibited by the core-shell semiconductor nanoparticles in the present embodiment tends to be longer than that of semiconductor nanoparticles not covered with the shell (namely, the semiconductor nanoparticles in the first embodiment), and may exceed 200 ns in some cases. This is because, due to covering with the shell, the relaxation processes in which nonradiative deactivation of excited electrons occurs are decreased, and the lifetime of the excited electrons at band-edge levels is increased. The core-shell nanoparticles in the present embodiment are considered to exhibit the band-edge emission, as long as the full width at half maximum is 80 nm or less even when the photoluminescence lifetime of the photoluminescence exceeds 200 ns.

Fourth Embodiment: Method of Producing Core-Shell Semiconductor Nanoparticles

Next, as the fourth embodiment, a method of producing the core-shell semiconductor nanoparticles in the third embodiment will be described. The method of producing the semiconductor nanoparticles each of which is to be the core is as described as the second embodiment.

In the covering of the semiconductor nanoparticles each of which is to be the core (hereinafter the core before being coated with a shell is referred to as "primary semiconductor nanoparticles" for convenience) with the shell, the primary semiconductor nanoparticles are dispersed in an appropriate solvent to prepare a dispersion. Subsequently, in the dispersion, a semiconductor layer is formed as the shell. Light-scattering does not occur in the liquid in which the primary semiconductor nanoparticles are dispersed. Thus, the obtained dispersion is generally transparent (colored or colorless). Any appropriate solvent may be used for dispersing the primary semiconductor nanoparticles thereinto. As in the production of the primary semiconductor nanoparticles, an appropriate organic solvent (in particular, an organic solvent with high polarity, such as ethanol) may be used. The organic solvent may be the surface modifier or a solution containing the surface modifier. For example, the organic solvent may be at least one selected from nitrogen-containing compounds comprising a hydrocarbon group with the carbon number of 4 to 20; or at least one selected from sulfur-containing compounds comprising a hydrocarbon group with the carbon number of 4 to 20; or a combination of at least one selected from the nitrogen-containing compounds comprising a hydrocarbon group with the carbon number of 4 to 20 and at least one selected from the sulfur-containing compounds comprising a hydrocarbon group with the carbon number of 4 to 20. More specifically, examples of the organic solvent include oleylamine, n-tetradecylamine, dodecanethiol, and combinations thereof.

The dispersion of the primary semiconductor nanoparticles may be prepared such that the proportion of the nanoparticles in the dispersion is, for example, 0.02% by mass to 1% by mass, and particularly 0.1% by mass to 0.6% by mass. If the proportion of the particles in the dispersion is too low, products are difficult to be collected in aggregation and precipitation processes by a poor solvent. If the proportion of the particles in the dispersion is too high, rate of Ostwald ripening and fusion of particles of the materials forming the core may be increased, which tends to widen the particle size distribution.

The formation of the semiconductor layer as the shell is performed by adding a compound containing a Group 13 element and either an elemental substance of a Group 16 element or a compound containing a Group 16 element to the dispersion described above. The compound containing the Group 13 element serves as a Group 13 element source, and is, for example, an organic salt, an inorganic salt, an organometallic compound of the Group 13, etc. More specifically, examples of the compound containing the Group 13 element include nitrate salts, acetate salts, sulfate salts, hydrochloride salts, sulfonate salts, and acetylacetonato complexes, and preferably organic salts, such as acetate salts, or organometallic compounds. This is because the organic salt and organometallic compound have high solubility in the organic solvent, which can facilitate uniformly proceeding the reaction.

An elemental substance of the Group 16 element or a compound containing the Group 16 element serves as a Group 16 element source. For example, in the case where sulfur (S) is a constituent element of the shell as the Group 16 element, the elemental sulfur, such as high-purity sulfur, can be used, or sulfur-containing compounds can be used. Examples of such sulfur-containing compounds include thiols, such as n-butanethiol, isobutanethiol, n-pentanethiol, n-hexanethiol, octanethiol, decanethiol, dodecanethiol, hexadecanethiol, and octadecanethiol; disulfides such as dibenzyldisulfide; thiourea; and thiocarbonyl compounds.

In the case where oxygen (O) is a constituent element of the shell as the Group 16 element, alcohols, ethers, carboxylic acids, ketones, or N-oxide compounds may be used as a Group 16 element source. In the case where selenium (Se) is a constituent element of the shell as the Group 16 element, an elemental selenium, or compounds, such as selenized phosphine oxides, organic selenium compounds (dibenzyldiselenide, diphenyldiselenide) or selenium hydrides, may be used as a Group 16 element source. In the case where tellurium (Te) is a constituent element of the shell as the Group 16 element, an elemental tellurium, tellurium phosphine oxides, or tellurium hydrides, may be used as a Group 16 element source.

Any appropriate method may be employed for adding the Group 13 element source and the Group 16 element source into the dispersion. For example, a mixture in which a Group 13 element source and a Group 16 element source may be dispersed or dissolved into an organic solvent may be prepared. Then, the mixture may be added to a dispersion little by little, for example, by dropping. In this case, the mixture may be added at a rate of 0.1 mL/hr to 10 mL/hr, and particularly at a rate of 1 mL/hr to 5 mL/hr. The mixture may be added to the heated dispersion. More specifically, for example, the temperature of the dispersion may be increased to a peak temperature of 200° C. to 300° C. After reaching the peak temperature, the mixture may be added little by little to the dispersion while holding the peak temperature, followed by decreasing the temperature of the dispersion with the mixture added, so that a shell layer may be formed (namely, a slow injection method). The peak temperature may be held if necessary even after the addition of the mixture is finished.

If the peak temperature is too low, the surface modifier that modifies the primary semiconductor nanoparticles cannot be removed sufficiently, or a chemical reaction for forming the shell does not proceed sufficiently. For these reasons, the semiconductor layer (shell) is not formed sufficiently in some cases. On the other hand, if the peak temperature is extremely high, the primary semiconductor nanoparticles sometimes have their quality altered, whereby even the formation of the shell cannot produce the band-edge emission in some cases. The time for holding the peak temperature may be set from one minute to 300 minutes, and particularly 10 minutes to 60 minutes in total after the start of the addition of the mixture. The time for holding at the peak temperature (i.e., temperature holding time) is selected in view of the relationship with the peak temperature. When the peak temperature is lower, the temperature holding time is increased. When the peak temperature is higher, the temperature holding time is decreased. In these manners, good shell layer can be easily formed. The temperature increasing rate and the temperature decreasing rate are not particularly limited. Decreasing of the temperature may be performed, for example, by holding the dispersion in which the mixture is added at the peak temperature for a predetermined time and then allowing the dispersion to cool by turning off a heating source (e.g., electric heater).

Alternatively, whole amounts of the Group 13 element source and the Group 16 element source may be added directly to the dispersion. Then, the dispersion to which the Group 13 element source and the Group 16 element source are added may be heated, so that the semiconductor layer can be formed as the shell on the surfaces of the primary semiconductor nanoparticles (namely, a heating-up method). More specifically, the temperature of the dispersion into which the Group 13 element source and the Group 16 element source are added may be gradually increased to a peak temperature of 200° C. to 300° C. After holding at the peak temperature for one to 300 minutes, the temperature of the dispersion may be gradually decreased. The temperature increasing rate may be set, for example, at 1° C./min to 50° C./min, and the temperature decreasing rate may be set, for example, at 1° C./min to 100° C./min. Alternatively, heating may be performed to a predetermined peak temperature without controlling the temperature increasing rate. Alternatively, the temperature decreasing may not be performed at a constant rate. The temperature decreasing may be performed by turning off the heating source. The issues in the case of the excessively low peak temperature or excessively high peak temperature have been described in description of the method of adding the mixture.

With the heating-up method, the core-shell semiconductor nanoparticles tend to be obtained, with band-edge emission of an intensity higher than that of the core-shell semiconductor nanoparticles in which the shell is formed by the slow-injection method.

The charging ratio of the Group 13 element source and the Group 16 element source preferably corresponds to the stoichiometric compositional ratio of the compound semiconductor consisting of the Group 13 element and the Group 16 element in any method of adding the Group 13 element source and the Group 16 element source. For example, in the case of using a Ga source as the Group 13 element source and a S source as the Group 16 element source, the charging ratio is preferably 1:1.5 (Ga:S) corresponding to a composition formula of $Ga_2S_3$. However, the charging ratio may not necessarily be the stoichiometric compositional ratio. In the case where the raw material is charged with an excessive amount compared to the intended produced amount of the shell, the amount of the Group 16 element source may be smaller than the stoichiometric compositional ratio. For example, the charging ratio may be 1:1 (the Group 13:the Group 16).

The charging amount is selected in view of an amount of the primary semiconductor nanoparticles contained in a dispersion such that the shell with a desired thickness is formed on the primary semiconductor nanoparticles contained in the dispersion. For example, the charging amounts of the Group 13 element source and the Group 16 element source may be selected such that the 0.01 mmol to 10 mmol, particularly 0.1 mmol to 1 mmol of the compound semiconductor consisting of the Group 13 element and the Group 16 element with stoichiometric composition is synthesized for the 10 nmol of the primary semiconductor nanoparticles, at amount of particles. The "amount of particles" refers to a molar amount assuming that the single particle is a giant molecule, and is equal to a value obtained by dividing the number of the nanoparticles contained in the dispersion by Avogadro number ($N_A = 6.022 \times 10^{23}$).

In the case of using the heating-up method to form the shell, increasing the temperature holding time (for example, 40 minutes or longer, particularly 50 minutes or longer, and the upper limit being, for example, 60 minutes or shorter) allows for easily obtaining the core-shell semiconductor nanoparticles with intense band-edge emission and a higher proportion of the band-edge emission (a larger intensity ratio of the band-edge emission/defect luminescence). However, when the temperature holding time is too increased, the intensity itself of the band-edge emission tends to be decreased, and photoluminescence is hardly obtained in some cases. The more the temperature holding time is increased, the more the peak of the band-edge emission emitted from the resultant semiconductor nanoparticles tends to be shifted toward the shorter-wavelength side, and the larger the full width at half maximum of the band-edge emission tends to be.

The shell is formed in this manner, so that the core-shell semiconductor nanoparticles are formed. The obtained core-shell semiconductor nanoparticles may be separated from the solvent. Further, the core-shell semiconductor nanoparticles may be further refined and dried, if needed. The methods of separation, refinement and drying are as described in the second embodiment, and thus their detailed description will be omitted.

Light-Emitting Device

As another embodiment, a light-emitting device will be described in which the semiconductor nanoparticles which have been described above, namely, the semiconductor nanoparticles in the first embodiment, the semiconductor nanoparticles produced by the method in the second embodiment (including the first to the third methods of producing the semiconductor nanoparticles), the core-shell semiconductor nanoparticles in the third embodiment, or the core-shell semiconductor nanoparticles produced by the method in the fourth embodiment (hereinafter these are collectively referred to as "the semiconductor nanoparticles of the present disclosure" or "the nanoparticles of the present disclosure") are used. The light-emitting device according to the present embodiment is a light-emitting device including a light conversion member and a semiconductor light-emitting element, wherein the light conversion member contains the semiconductor nanoparticles of the present disclosure. In such a light-emitting device, for example, the semiconductor nanoparticles of the present disclosure absorb a portion of light emitted from the semiconductor light-emitting element, and then emit light of a longer wavelength. Light from the semiconductor nanoparticles of the present disclosure and the rest of light emitted from the semiconductor light-emitting element are mixed together, and the mixed light can then be used as the light emission from the light-emitting device.

More specifically, with the semiconductor light-emitting element configured to emit blue-violet or blue light with a peak wavelength of about 400 nm to about 490 nm and the semiconductor nanoparticles of the present disclosure configured to absorb blue light and emit yellow light therefrom (for example, the semiconductor nanoparticles in the above first embodiment having an average particle size of 4.0 to 5.0 nm), a light-emitting device configured to emit white light can be obtained. Alternatively, with two kinds of semiconductor nanoparticles of the present disclosure, of which one kind of semiconductor nanoparticles configured to absorb blue light and emit green light and the other kind of semiconductor nanoparticles configured to absorb blue light and emit red light, a white light-emitting device can be obtained. Further, alternatively, with a semiconductor light-emitting element configured to emit ultraviolet light with a peak wavelength of 400 nm or less, and three kinds of semiconductor nanoparticles of the present disclosure that absorb the ultraviolet light and emit blue, green, and red lights, respectively, a white light-emitting device can be obtained. In this case, to avoid the leak of the ultraviolet light emitted from the light-emitting element toward the outside, the entirety of light from the light-emitting element is desirably absorbed and converted by the semiconductor nanoparticles of the present disclosure.

Moreover, alternatively, with a light-emitting element configured to emit a blue-green light with a peak wavelength of about 490 nm to 510 nm and the semiconductor nanoparticles of the present disclosure configured to absorb the blue-green light and emit red light, a device configured to emit white light can be obtained.

Furthermore, alternatively, with a semiconductor light-emitting element configured to emit red light with a wavelength of 700 nm to 780 nm and the semiconductor nanoparticles of the present disclosure configured to absorb the red light and emit near-infrared light, a light-emitting device configured to emit near-infrared light can be obtained.

The semiconductor nanoparticles of the present disclosure may be used in combination with other semiconductor quantum dots, or any phosphors other than quantum dots (e.g., an organic phosphor or an inorganic phosphor). Other semiconductor quantum dots may be, for example, binary semiconductor quantum dots mentioned in the Background section in the present specification. For the phosphors other than quantum dots, garnet-based phosphors, such as an aluminum garnet-based phosphor, can be used. Examples of the garnet phosphors include an yttrium-aluminum-garnet-based phosphor activated by cerium, and a lutetium-aluminum-garnet-based phosphor activated by cerium. Examples of the phosphors other than quantum dots include a nitrogen-containing calcium aluminosilicate-based phosphor activated by europium and/or chromium; a silicate-based phosphor activated by europium; a nitride-based phosphor such as a β-SiAlON-based phosphor, a CASN-based phosphor, and a SCASN-based phosphor; a rare earth nitride-based phosphor such as $LnSi_3N_{11}$-based phosphor and a LnSiAlON-based phosphor; an oxynitride-based phosphor such as a $BaSi_2O_2N_2$:Eu-based phosphor and $Ba_3Si_6O_{12}N_2$:Eu-based phosphor; a sulfide-based phosphor such as a CaS-based phosphor, a $SrGa_2S_4$-based phosphor, a $SrAl_2O_4$-based phosphor, and a ZnS-based phosphor; a chlorosilicate-based phosphor; $SrLiAl_3N_4$:Eu phosphor; $SrMg_3SiN_4$:Eu phosphor; and $K_2SiF_6$:Mn phosphor as a fluoride complex phosphor activated by manganese may be used.

The light conversion member which contains the semiconductor nanoparticles of the present disclosure in the light-emitting device may have, for example, a sheet-like shape or a plate-like shaped member, or may be a member with a three-dimensional shape. Examples of the member with the three-dimensional shape include a sealing member of a surface-mounted light-emitting diode in which a semiconductor light-emitting element is arranged at a bottom surface of a recess defined in a package. The sealing member is formed by charging resin into the recess to seal the light-emitting element.

Alternatively, other examples of the light conversion member include a resin member formed with a substantially uniform thickness to enclose upper surface and lateral surfaces of a semiconductor light-emitting element arranged on a planar substrate. Further, alternatively, in the case where a resin member which contains a reflective material is filled at the periphery of a semiconductor light-emitting element such that an upper end of the resin member is in the same plane with the semiconductor light-emitting element, further other examples of the light conversion member include a plate-shaped resin member with a predetermined thickness arranged on an upper side of the semiconductor light-emitting element and the above-described resin member which contains the reflective material.

The light conversion member may be in contact with the semiconductor light-emitting element, or may be disposed spaced from the semiconductor light-emitting element. More specifically, the light conversion member may be a pellet-shaped member, a sheet member, a plate-shaped member, or a stick-shaped member, which is disposed spaced from the semiconductor light-emitting element. Alternatively, the light conversion member may be a member which is disposed in contact with the semiconductor light-emitting element for example, a seal member, a coating member (i.e., member covering the light-emitting element disposed spaced from the mold member), or a mold member (e.g., including a lens-shaped member). In the case of using two or more kinds of semiconductor nanoparticles of the present disclosure to exhibit photoluminescence with different wavelengths in the light-emitting device, one light conversion member may contain a mixture of the two or more kinds of semiconductor nanoparticles of the present disclosure, or alternatively, a combination of two or more light conversion members, each of which contains only one kind of quantum dots, may be used. In this case, two or more kinds of light conversion members may be layered, or may be arranged on a plane in a dot-like or striped pattern.

Examples of the semiconductor light-emitting element include a light-emitting diode (LED) chip. The LED chip may include a semiconductor layer made of one or more kinds of compounds selected from the group consisting of GaN, GaAs, InGaN, AlInGaP, GaP, SiC, and ZnO. The semiconductor light-emitting element configured to emit blue-violet light, blue light, or ultraviolet light preferably includes, as a semiconductor layer, a GaN based compound represented by a general formula of $In_xAl_yGa_{1-x-y}N$ ($0 \leq X$, $0 \leq Y$, $X+Y<1$).

The light-emitting device in this embodiment is preferably incorporated as a light source in a liquid crystal display device. Since the band-edge emission produced by the semiconductor nanoparticles of the present disclosure has a short photoluminescence lifetime, the light-emitting device using the semiconductor nanoparticles is suitable for use as a light source for the liquid crystal display device that requires a relatively high response speed. The semiconductor nanoparticles of the present disclosure can exhibit the photoluminescence peak with a smaller full width at half maximum as the band-edge emission. Thus, the liquid crystal display device that exhibits excellent color reproducibility can be obtained without using a color filter with a dense color, if, in the light-emitting device:
the blue semiconductor light-emitting element is adapted to produce the blue light with a peak wavelength of 420 nm to 490 nm; and the semiconductor nanoparticles of the present disclosure are adapted to produce the green photoluminescence with a peak wavelength of 510 nm to 550 nm, preferably 530 nm to 540 nm, and the red photoluminescence with a peak wavelength of 600 nm to 680 nm, preferably 630 nm to 650 nm, respectively; or
the semiconductor light-emitting element is adapted to produce the ultraviolet light with a peak wavelength of 400 nm or less; and the semiconductor nanoparticles of the present disclosure are adapted to produce the blue photoluminescence with a peak wavelength of 430 nm to 470 nm, preferably 440 nm to 460 nm, the green photoluminescence with a peak wavelength of 510 nm to 550 nm, preferably 530 nm to 540 nm, and the red photoluminescence with a peak wavelength of 600 nm to 680 nm, preferably 630 nm to 650 nm, respectively. The light-emitting device of this embodiment is used, for example, as a direct illumination-type backlight or an edge illumination-type backlight.

Alternatively, a sheet, a plate-shaped member, or a rod-shaped member made of a resin, glass, or the like, which contains the semiconductor nanoparticles of the present disclosure, may be incorporated as a light conversion member independently from the light-emitting device, into a liquid crystal display device.

EXAMPLES

Examples 1 to 3

First, 0.10 mmol of silver acetate (AgOAc), 0.15 mmol of indium acetate (In(OAc)$_3$), and 0.25 mmol of thiourea were placed into a mixture of 0.10 cm$^3$ of 1-dodecanethiol and 2.90 cm$^3$ of oleylamine, and dispersed. In the silver acetate and the indium acetate, Ag/(Ag+In) was 0.4 in all of the Examples. The dispersion was put into a test tube together with a stirring bar, and nitrogen substitution was performed, followed by heat treatment under the conditions shown in Table 1, while stirring the content in the test tube under a nitrogen atmosphere.

TABLE 1

| | Heat treatment in the first step | | Heat treatment in the second step |
|---|---|---|---|
| | 50° C. | 150° C. | 250° C. |
| Example 1 | 10 min | — | 10 min |
| Example 2 | — | 10 min | 10 min |
| Example 3 | — | — | 10 min |

All of the heat treatments were performed at each of the predetermined temperature for 10 minutes. After heat treatment, the obtained suspension was allowed to cool, followed by centrifugal separation (with a radius of 146 mm at 4,000 rpm for 5 minutes), so that a supernatant solution was taken out. Then, methanol was added to the supernatant solution until nanoparticles were precipitated, followed by centrifugal separation (with a radius of 146 mm at 4,000 rpm for 5 minutes), thereby precipitating the nanoparticles. The precipitates were taken out and dissolved in chloroform, and the following measurement was performed.

An XRD pattern of the semiconductor nanoparticles obtained in Example 2 was measured and compared with an XRD pattern of AgInS$_2$ having a tetragonal system (of a chalcopyrite type) and an XRD pattern of AgInS$_2$ having an orthorhombic system. The measured XRD pattern is shown in FIG. 1. The XRD pattern shows that the crystal structure of the semiconductor nanoparticles in Example 2 is substantially the same as the tetragonal AgInS$_2$. The XRD pattern was measured using a powder X-ray diffractometer manufactured by RIGAKU Corporation (trade name: SmartLab). Note that the same goes for the Examples in the below disclosures.

The shapes of the obtained semiconductor nanoparticles were observed using a transmission electron microscope (TEM, manufactured by HITACH HIGH-TECHNOLOGIES Corporation, trade name: H-7650), and the average particle size was measured from TEM images at a magnification of 80,000× to 200,000×. Here, a commercially available Cu grid having an elastic carbon supporting membrane (manufactured by OKENSHOJI Co., Ltd.) was used as the TEM grid. The shape of the obtained particles was spherical or polygonal.

An average particle size was determined by measuring the particle sizes of all measurable nanoparticles included in TEM images, i.e., all particles except for nanoparticles whose images were cut at the edges of the images, and calculating an arithmetic average of the measured particle sizes. When the number of nanoparticles included in one TEM image is less than 100, another TEM image was measured and the particle sizes of the particles included in this TEM image were measured, and then the arithmetic average was calculated from 100 or more particles.

The average particle size of the semiconductor nanoparticles in each Example was as follows:
Example 1: 4.1 nm
Example 2: 4.6 nm
Example 3: 5.1 nm Next, the proportion of each of Ag, In and S atoms in the obtained semiconductor nanoparticles was determined using an energy dispersive X-ray spectrometer (manufactured by HORIBA, Ltd., EMAX Energy), by assuming that the total number of atoms of Ag, In, and S included in the semiconductor nanoparticles was 100. The result is shown in Table 2.

Measurement using an energy dispersive X-ray spectrometer was specifically performed in the following procedures. Note that the same goes for the Examples in the below.

The produced nanoparticles-dispersed solution was dropped onto a carbon tape fixed to a sample stage, and dried. Using signals derived from Ag, In, and S from the spectrum observed with an energy dispersive X-ray spectrometer, each component was quantitatively determined based on the intensity of the signals. Five-point measurement was performed while changing the measurement sites, and the average thereof was used as the result.

TABLE 2

| | S | Ag | In | Ag/(Ag + In) | S/(Ag + In) |
|---|---|---|---|---|---|
| Example 1 | 57.3 | 16.3 | 26.4 | 0.382 | 1.34 |
| Example 2 | 56.5 | 15.7 | 27.8 | 0.361 | 1.3 |
| Example 3 | 57.2 | 15.9 | 26.9 | 0.371 | 1.34 |

The absorption and photoluminescence spectra of the semiconductor nanoparticles obtained in Examples 1 to 3 were measured. The results are shown in FIG. 2 (absorption spectrum, Example 1: solid line, Example 2: dot-and-dash line, Example 3: dotted line) and FIG. 3 (photoluminescence spectrum, Example 1: solid line, Example 2: dot-and-dash line, Example 3: dotted line). The absorption spectrum was measured at wavelengths of 190 nm to 1,100 nm using a diode array spectrophotometer (manufactured by Agilent Technologies Japan, Ltd., trade name: Agilent 8453A). The photoluminescence spectrum was measured at an excitation wavelength of 365 nm using a multi-channel spectrometer (manufactured by HAMAMATSU PHOTONICS K.K., trade name: PMA11). The wavelength and the full width at half maximum of a sharp photoluminescence peak observed in the photoluminescence spectrum in each Example are as follows: Example 1: around 590 nm, full width at half maximum 42 nm Example 2: around 590 nm, full width at half maximum 50 nm Example 3: around 590 nm, full width at half maximum 55 nm In measurement of the photoluminescence lifetime, using a fluorescence lifetime measurement device (trade name: Quantaurus-Tau) manufactured by HAMAMATSU PHOTONICS K.K, the semiconductor nanoparticles were irradiated with light having a wavelength of 470 nm as the excitation light to emit light having a wavelength different from that of the excitation light, and a decay curve of the photoluminescence at around the peak wavelength of the sharp photoluminescence peak was measured. The obtained decay curve was divided into three components by parameter fitting using a fluorescence lifetime measurement/analysis software U11487-01, manufactured by HAMAMATSU PHOTONICS K.K. As a result, $\tau_1$, $\tau_2$, and $\tau_3$, and contribution rates of respective components ($A_1$, $A_2$, and $A_3$) were determined as shown in Table 3 below.

TABLE 3

| | $\tau_1$ (ns) | $A_1$ (%) | $\tau_2$ (ns) | $A_2$ (%) | $\tau_3$ (ns) | $A_3$ (%) | Photo-luminescence lifetime (ns) |
|---|---|---|---|---|---|---|---|
| Example 2 | 6.56 | 50.5 | 25.9 | 41.3 | 95.1 | 8.2 | 25.9 |

The photoluminescence lifetime ($\tau_2$: 25.9 ns) of the main component in Example 2 was similar to the lifetime (30 to 60 ns) of CdSe nanoparticles in which band-edge emission was confirmed, and this photoluminescence was found to be due to the band edge.

In Example 1, the intensity of the band-edge emission was smaller than the intensity of other types of photoluminescence (including defect luminescence) observed at a longer-wavelength side than the band-edge emission. It is assumed that this is because the temperature of the heat treatment in the first step in Example 1 was lower than that in Example 2.

In the absorption spectra in Examples 2 and 3, an exciton peak was observed at around 550 nm.

Example 4, Comparative Examples 1 and 2

Silver acetate (AgOAc) and indium acetate (In(OAc)$_3$) were weighed so that Ag/(Ag+In) is 0.3 (Comparative Example 1), 0.4 (Example 4), and 0.5 (Comparative Example 2), and the total amount of two metallic salts is 0.25 mmol. Silver acetate (AgOAc), indium acetate (In(OAc)$_3$), and 0.25 mmol of thiourea were placed into a mixture of 0.10 cm$^3$ of oleylamine and 2.90 cm$^3$ of 1-dodecanethiol, and dispersed. The dispersion of silver acetate and indium acetate was put into a test tube together with a stirring bar, and nitrogen substitution was performed, followed by heating at 150° C. for 10 minutes (heat treatment in the first step) and further heating at 250° C. for 10 minutes (heat treatment in the second step), while stirring the content in the test tube under a nitrogen atmosphere.

After the heat treatment, the obtained suspension was allowed to cool, followed by centrifugal separation (with a radius of 146 mm at 4,000 rpm for 5 minutes).

In Comparative Example 1, after the precipitates were washed with methanol, chloroform was added to the precipitates, followed by centrifugal separation (with a radius of 146 mm at 4,000 rpm for 15 minutes), and the supernatant solution was collected, and then the following measurement was performed.

In Example 4 and Comparative Example 2, a supernatant solution was taken out. Then, methanol was added to this until nanoparticles were precipitated, followed by centrifugal separation (with a radius of 146 mm at 4,000 rpm for 5 minutes), thereby precipitating the nanoparticles. The precipitates were taken out and dissolved in chloroform, and the following measurement was performed.

Although the nanoparticles in Example 4 were produced under the same conditions as in Example 2, they were produced separately from those in Example 2, and thus the average particle size and so on are slightly different from those in Example 2.

The shape of the obtained semiconductor nanoparticles was observed, and the average particle size was measured. The shape of the obtained particles was a spherical or polygonal shape. The average particle size in Comparative Example 1 was 10.4 nm, the average particle size in Example 4 was 4.3 nm, and the average particle size in Comparative Example 2 was 3.8 nm.

Next, the proportion of each of Ag, In and S atoms in the obtained semiconductor nanoparticles was determined using a fluorescent X-ray analyzer (manufactured by RIGAKU Corporation, trade name: EDXL300), by assuming that the total number of atoms of Ag, In, and S included in the semiconductor nanoparticles was 100. The result is shown in Table 4.

TABLE 4

|  | S | Ag | In | Ag/(Ag + In) | S/(Ag + In) |
|---|---|---|---|---|---|
| Comparative Example 1 | 55.5 | 19.3 | 25.2 | 0.43 | 1.24 |
| Example 4 | 57.3 | 15.9 | 26.9 | 0.37 | 1.34 |
| Comparative Example 2 | 55.3 | 21.8 | 23 | 0.49 | 1.23 |

Figure 4:
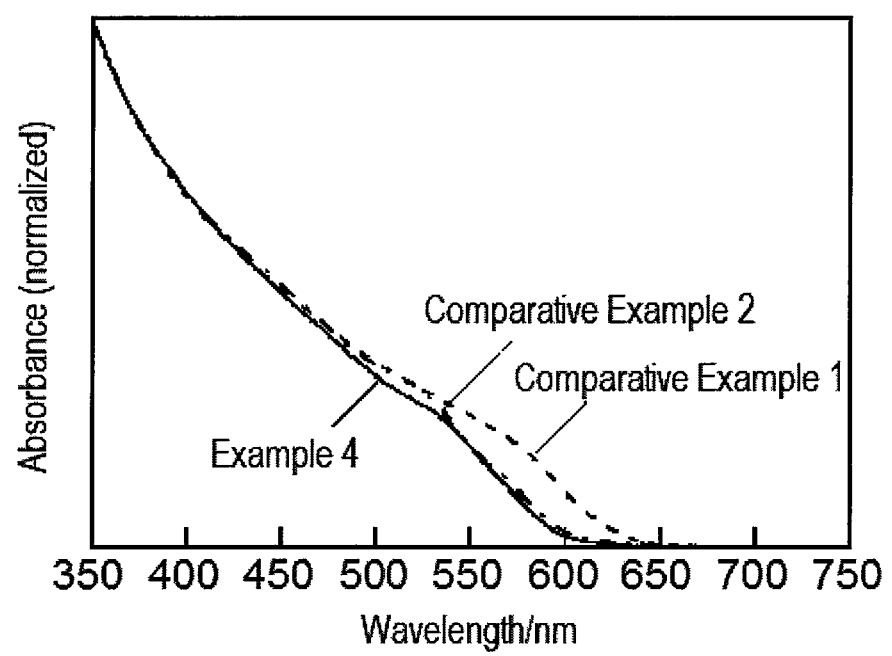
FIG. 4 shows absorption spectra of the semiconductor nanoparticles in Example 4 and Comparative Examples 1 to 2.

The absorption and photoluminescence spectra of the semiconductor nanoparticles obtained in Comparative Examples 1 to 2 and Example 4 were measured. The results are shown in FIG. 4 (absorption spectrum, Example 4: solid line, Comparative Example 1: dotted line, Comparative Example 2: dot-and-dash line) and FIG. 5 (photoluminescence spectrum, Example 4: solid line, Comparative Example 1: dotted line, Comparative Example 2: dot-and-dash line).

Measurements of the absorption spectra and the photoluminescence spectra were performed using the devices and methods mentioned in Examples 1 to 3.

Figure 5:
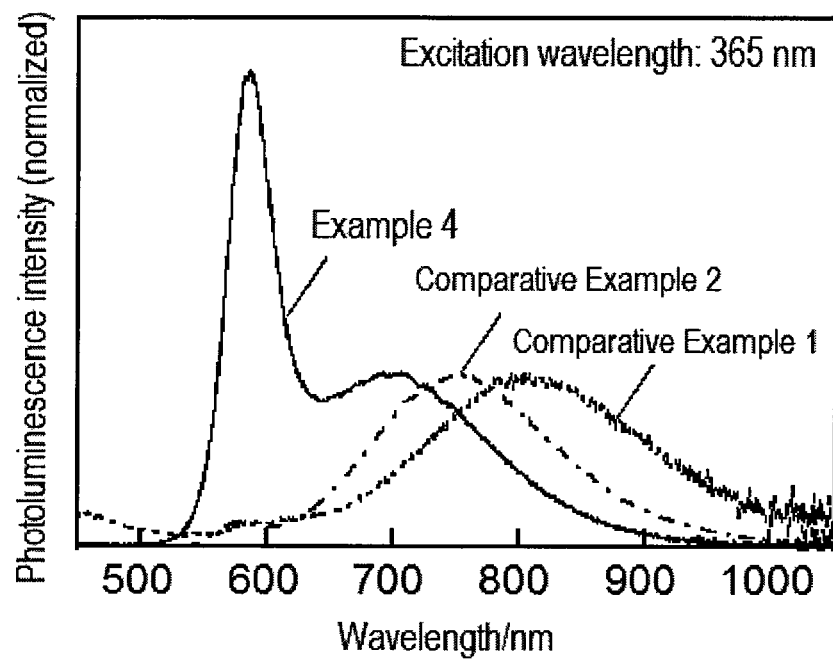
FIG. 5 shows photoluminescence spectra of the semiconductor nanoparticles in Example 4 and Comparative Examples 1 and 2.

As shown in FIG. 5, in each of the photoluminescence spectra in Comparative Examples 1 and 2, a small peak is observed at a wavelength of around 580 nm, which corresponds to the peak wavelength of the band-edge emission in Example 4, but the intensity was extremely small.

An exciton peak was observed at around 570 nm in the absorption spectrum in Comparative Example 1, and an exciton peak was observed at around 530 nm in the absorption spectrum in Comparative Example 2.

Example 5

<1> Production of Cores (Primary Semiconductor Nanoparticles)

Silver acetate (AgOAc) and indium acetate (In(OAc)$_3$) were weighed so that Ag/(Ag+In) is 0.4, and the total amount of two metallic salts is 0.25 mmol. Silver acetate (AgOAc), indium acetate (In(OAc)$_3$), and 0.25 mmol of thiourea were placed into a mixture of 0.10 cm$^3$ of oleylamine and 2.90 cm$^3$ of 1-dodecanethiol, and dispersed. The dispersion of silver acetate and indium acetate was put into a test tube together with a stirring bar, and nitrogen substitution was performed, followed by heating at 150° C. for 10 minutes (heat treatment in the first step) and further heating at 250° C. for 10 minutes (heat treatment in the second step), while stirring the content in the test tube under a nitrogen atmosphere.

After heat treatment, the obtained suspension was allowed to cool, followed by centrifugal separation (with a radius of 146 mm at 4,000 rpm for 5 minutes), so that a supernatant solution was taken out. Then, methanol was added to the supernatant solution until nanoparticles were precipitated, followed by centrifugal separation (with a radius of 146 mm at 4,000 rpm for 5 minutes), thereby precipitating the nanoparticles. Ethanol was added to the precipitates, and the solution was stirred, followed by centrifugal separation (with a radius of 146 mm at 4,000 rpm for 5 minutes) again, thereby precipitating the nanoparticles. The precipitates were taken out and dissolved in chloroform, and the following measurement was performed.

The shape of the obtained semiconductor nanoparticles was observed, and the average particle size was measured. The shape of the obtained particles was a spherical or polygonal shape. The average particle size was 4.6 nm.

Next, the proportion of each of Ag, In and S atoms in the obtained semiconductor nanoparticles was determined using a fluorescent X-ray analyzer (manufactured by RIGAKU Corporation, trade name: EDXL300), by assuming that the total number of atoms of Ag, In, and S included in the semiconductor nanoparticles was 100. The result is shown in Table 5.

TABLE 5

|  | S | Ag | In | Ag/(Ag + In) | S/(Ag + In) |
|---|---|---|---|---|---|
| Example 5 (core) | 56.8 | 15.8 | 27.4 | 0.37 | 1.31 |

Figure 6:
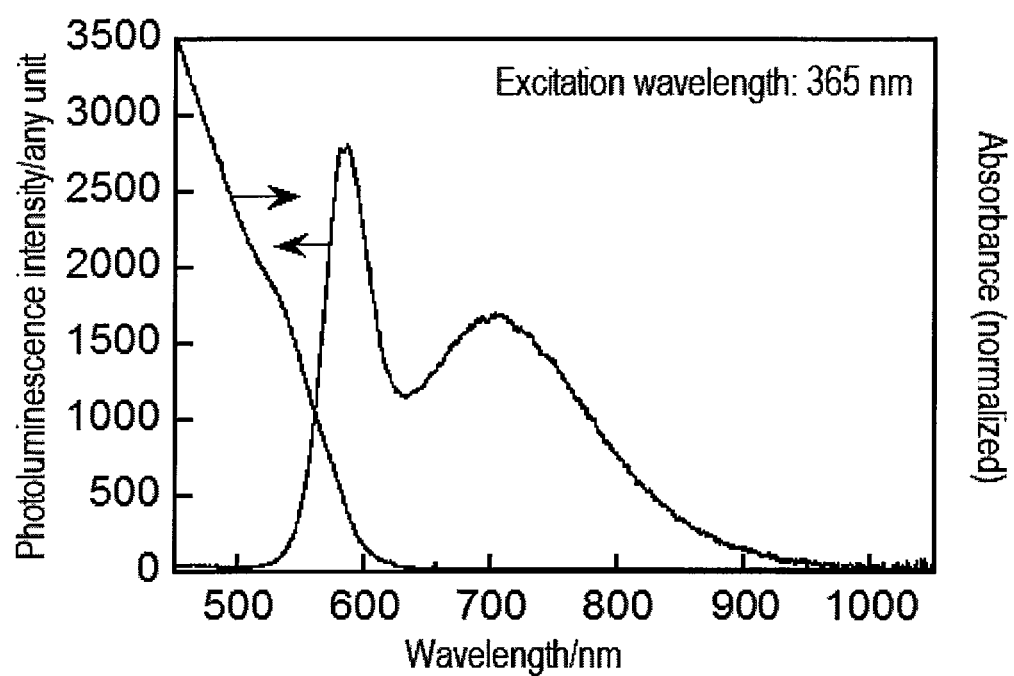
FIG. 6 shows a photoluminescence/absorption spectrum of the cores (primary semiconductor nanoparticles) produced in Example 5.

The absorption and photoluminescence spectra of the obtained semiconductor nanoparticles were measured. The methods for measuring the absorption spectrum and the photoluminescence spectrum are the same as in Examples 1 to 3. The result is shown in FIG. 6. As shown in FIG. 6, in the photoluminescence spectrum of the semiconductor nanoparticles, a sharp photoluminescence peak having a peak wavelength at a wavelength of around 580 nm and a full width at half maximum of 50 nm was observed, and a broad photoluminescence peak having a peak wavelength at a wavelength of around 705 nm was observed.

The photoluminescence lifetime was measured by the same method as that employed in Example 2. The result is shown in Table 6.

TABLE 6

|  | $\tau_1$ (ns) | $A_1$ (%) | $\tau_2$ (ns) | $A_2$ (%) | $\tau_3$ (ns) | $A_3$ (%) | Photoluminescence lifetime (ns) |
|---|---|---|---|---|---|---|---|
| Example 5 (core) | 8.13 | 65.9 | 39.3 | 31.3 | 163 | 2.8 | 39.3 |

The photoluminescence lifetime ($\tau_2$: 39.3 ns) of the main component of the semiconductor nanoparticles was similar to the lifetime (30 to 60 ns) of CdSe nanoparticles in which band-edge emission was confirmed, and this photoluminescence was found to be due to the band edge.

<2> Production of Core-Shell Semiconductor Nanoparticles (Formation of Shell)

Using the semiconductor nanoparticles produced in the above section <1> as cores (primary semiconductor nanoparticles), a shell was formed on the surface of the core.

More specifically, $1.0 \times 10^{-3}$ mmol (10 nmol) of the primary semiconductor nanoparticles produced in the section <1> at amount of nanoparticles, $5.33 \times 10^{-3}$ mmol of gallium acetylacetonate (Ga(acac)$_3$), $5.33 \times 10^{-3}$ mmol of thiourea, 2.9 cm$^3$ of oleylamine, and 0.1 cm$^3$ of 1-dodecanethiol were put into a test tube and held at 300° C. for 60 minutes, and then the heating source was turned off to allow the solution to cool. Then, the solution was subjected to centrifugal separation (with a radius of 146 mm at 4,000 rpm for 5 minutes), thereby precipitating the nanoparticles. The supernatant solution was discarded, methanol was added to the precipitates, and the solution was stirred, followed by centrifugal separation (with a radius of 146 mm at 4,000 rpm for 5 minutes) again, thereby precipitating the nanoparticles. The precipitates were taken out, ethanol was added thereto, and the solution was stirred, followed by centrifugal separation (with a radius of 146 mm at 4,000 rpm for 5 minutes) again, thereby precipitating the nanoparticles. The precipitates were taken out and dissolved in chloroform, and the following measurement was performed.

The shape of the obtained core-shell semiconductor nanoparticles was observed, and the average particle size was measured. The shape of the obtained particles was a spherical or polygonal shape. The average particle size was 6.5 nm. The average thickness of the shell was about 0.95 nm based on a difference in the average particle size between the cores and the core-shell semiconductor nanoparticles.

Figure 7:
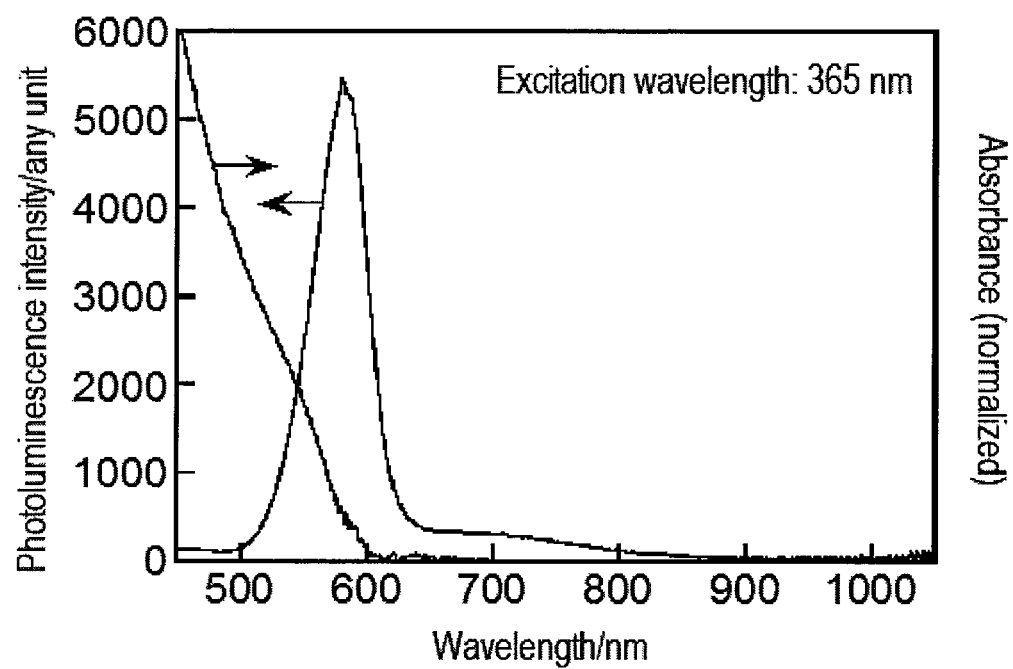
FIG. 7 shows a photoluminescence/absorption spectrum of the core-shell semiconductor nanoparticles produced in Example 5.

The absorption and photoluminescence spectra of the obtained core-shell semiconductor nanoparticles were measured. The methods for measuring the absorption spectrum and the photoluminescence spectrum are the same as in Examples 1 to 3. The result is shown in FIG. 7. As shown in FIG. 7, in the photoluminescence spectrum of the semiconductor nanoparticles, a sharp photoluminescence peak (band-edge emission) having a peak wavelength of around 580 nm and a full width at half maximum of 49 nm was observed. The intensity of a broad photoluminescence peak (defect luminescence) having a peak wavelength at a wavelength of around 710 nm was extremely small. The intensity of the band-edge emission that is normalized by the intensity of the defect luminescence was 18. This result showed that covering with a specific shell is effective for increasing the proportion of the band-edge emission.

The photoluminescence lifetime was measured by the same method as that employed in Example 2. The result is shown in Table 7.

TABLE 7

| | $\tau_1$ (ns) | $A_1$ (%) | $\tau_2$ (ns) | $A_2$ (%) | $\tau_3$ (ns) | $A_3$ (%) | Photo-luminescence lifetime (ns) |
|---|---|---|---|---|---|---|---|
| Example 5 (core) | 5.44 | 68.2 | 51.9 | 25.7 | 248 | 6.1 | 248 |

The photoluminescence lifetime ($\tau_3$: 248 ns) of the main component of the core-shell semiconductor nanoparticles was confirmed to be longer than that of the core. A component ($\tau_2$, $A_2$) with a photoluminescence lifetime of 51.9 ns was observed with their intensity being similar to that of the main component. This photoluminescence lifetime was similar to the fluorescence lifetime (30 ns to 60 ns) of the component with the largest contribution rate in the fluorescence emitted by CdSe (nanoparticles) in which band-edge emission was confirmed.

Figure 8:
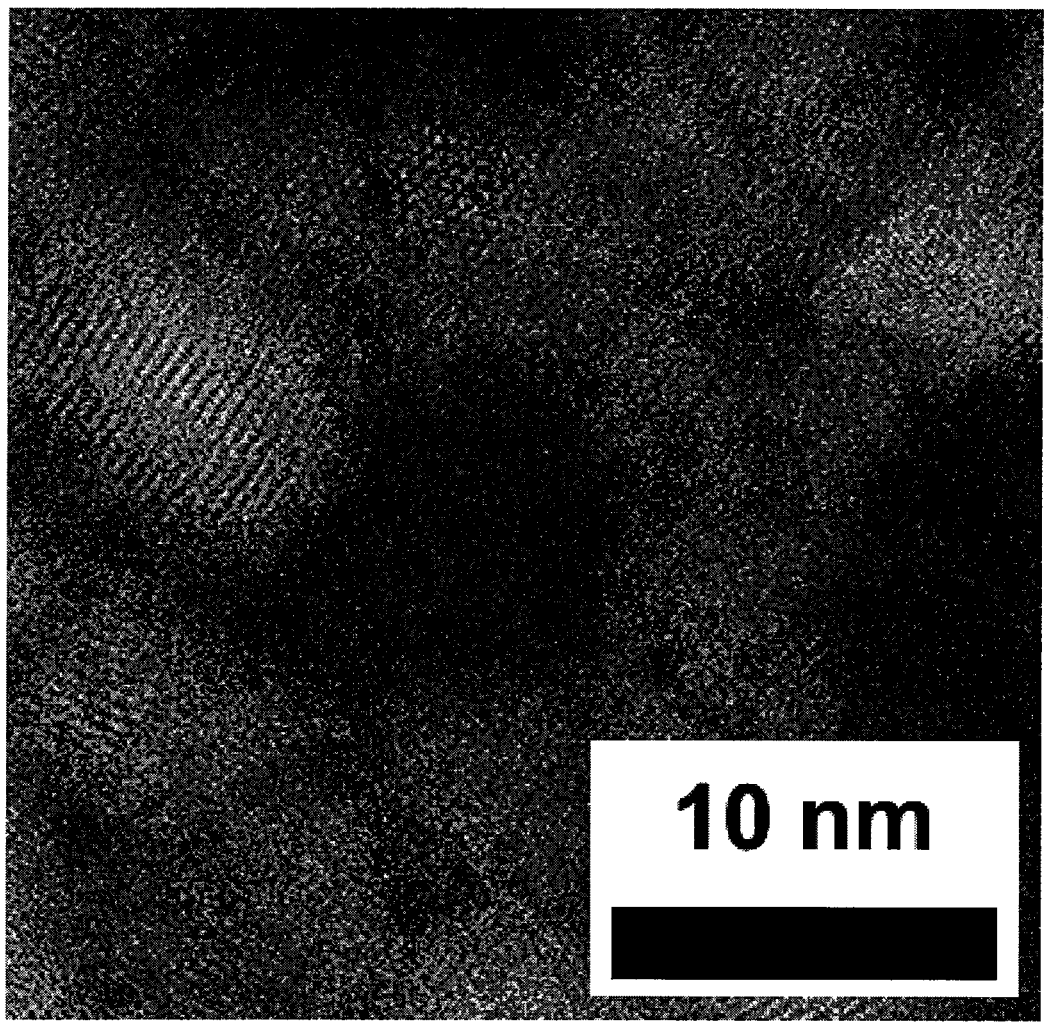
FIG. 8 shows a high-angle annular dark field (HAADF) image of the core-shell semiconductor nanoparticles produced in Example 5.

The obtained core-shell semiconductor nanoparticles were observed with HAADF-STEM (manufactured by JEOL Ltd., trade name: JEM-ARM200F Cold). FIG. 8 shows an HAADF image. In the HAADF image, a crystal core with a regular pattern and a shell surrounding the core and having no regular pattern were observed, and the shell was observed to be amorphous in the particles.

Figure 9:
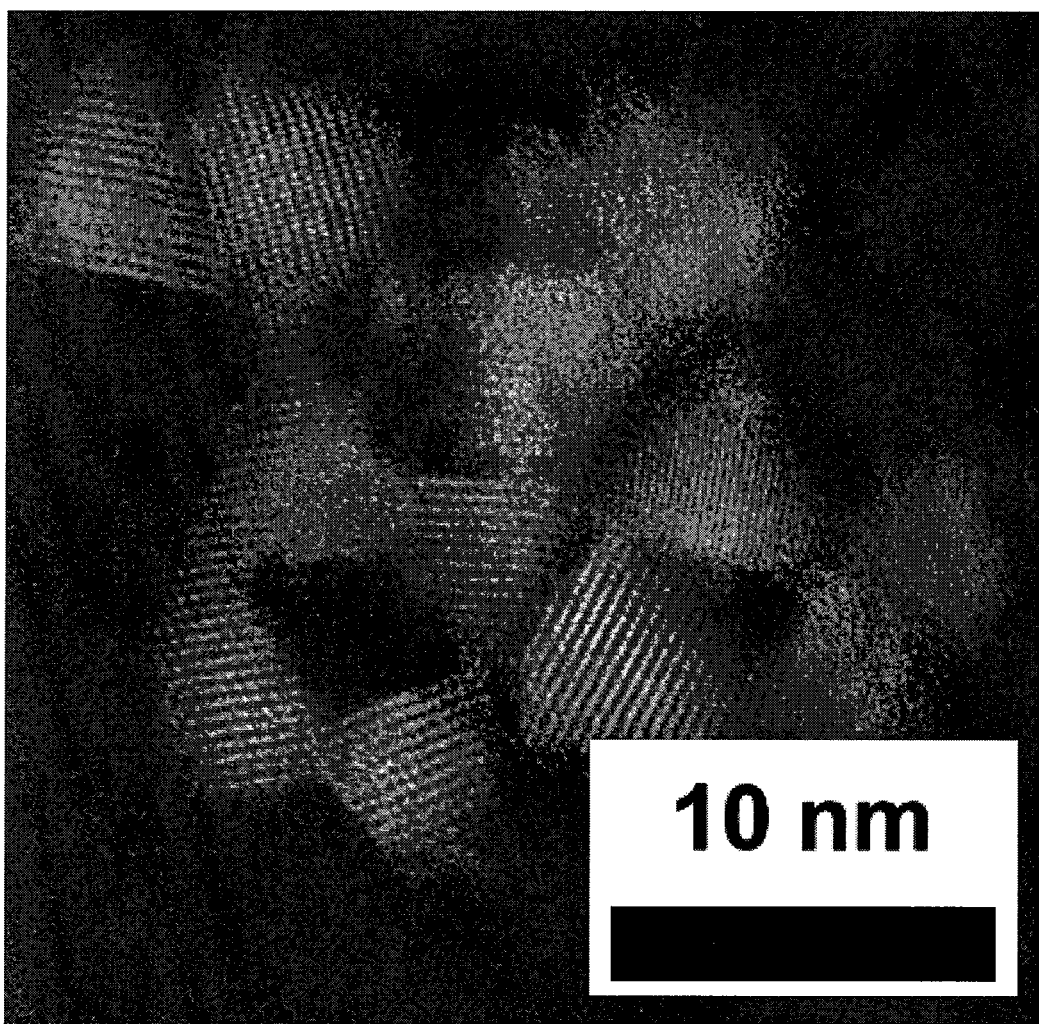
FIG. 9 shows an HAADF image of the cores (primary semiconductor nanoparticles) produced in Example 5.

For comparison, an HAADF image of the semiconductor nanoparticles (cores) obtained in the section <1> is shown in FIG. 9. In the HAADF image shown in FIG. 9, only crystal particles with a regular pattern were observed, and a region having no regular pattern surrounding them was not observed.

In the obtained core-shell semiconductor nanoparticles, the atomic percentages of S (sulfur) and Ga (gallium), which were included in a central region in which a crystal core with a regular pattern was observed in the HAADF image, and in a surrounding region in which a shell with no regular pattern was observed in the HAADF image, were analyzed with an energy dispersive X-ray spectrometer (EDS) (manufactured by HORIBA, Ltd., trade name: EMAX Energy). The atomic percentages of S and Ga are proportions assuming that the total number of atoms of Ag, In, Ga, and S is 100%. The result of the analysis is shown in Table 8.

TABLE 8

| | S | Ga |
|---|---|---|
| Central region (core) | 58.1 | 4.6 |
| Surrounding region (shell) | 74.7 | 15.7 |

As shown in Table 8, the proportions of Ga and S in the surrounding region were higher than those in the central region. This result demonstrated that, in terms of element composition, the obtained particles have a core-shell structure in which GaS$_x$ is segregated on the surfaces of the particles.

The embodiments of the present disclosure provide the semiconductor nanoparticles that enable the band-edge emission and can be used as a wavelength conversion material of a light-emitting device or as a biomolecule marker.

The invention claimed is:

1. A semiconductor nanoparticle containing Ag, In, and S; and having an average particle size of 50 nm or less, the semiconductor nanoparticle being adapted to emit photoluminescence having a photoluminescence lifetime of 200 ns or less upon being irradiated with light having a wavelength in a range of 350 nm to 500 nm, wherein
a ratio of a number of atoms of Ag to a total number of atoms of Ag and In is 0.320 or more and 0.385 or less, and
a ratio of a number of atoms of S to the total number of atoms of Ag and In is 1.20 or more and 1.45 or less.

2. A light-emitting device comprising a light conversion member and a semiconductor light-emitting element, wherein the light conversion member contains a plurality of the semiconductor nanoparticles according to claim 1.

3. The light-emitting device according to claim 2, wherein the semiconductor light-emitting element is a light-emitting diode chip.

4. A core-shell semiconductor nanoparticle comprising:
a core; and
a shell covering a surface of the core, the shell being in heterojunction with the core, wherein
the core is made of a semiconductor that contains Ag, In, and S, wherein a ratio of a number of atoms of Ag to a total number of atoms of Ag and In is 0.320 or more and 0.385 or less, and a ratio of a number of atoms of S to the total number of atoms of Ag and In is 1.20 or more and 1.45 or less,
the shell is a semiconductor that consists essentially of a Group 13 element and a Group 16 element, and
in a photoluminescence spectrum obtained when the core-shell semiconductor nanoparticle is irradiated with light having a wavelength in a range of 350 nm to 500 nm, a photoluminescence peak having a peak wavelength in a range of 550 nm to 650 nm and a full width at half maximum of 80 nm or less is observed.

5. The core-shell semiconductor nanoparticle according to claim 4, wherein the Group 13 element contains Ga and the Group 16 element contains S.

6. A light-emitting device comprising a light conversion member and a semiconductor light-emitting element, wherein the light conversion member contains a plurality of the core-shell semiconductor nanoparticles according to claim 4.

7. The light-emitting device according to claim 6, wherein the semiconductor light-emitting element is a light-emitting diode chip.

* * * * *